United States Patent [19]

Chamberlain

[11] Patent Number: 4,471,483
[45] Date of Patent: Sep. 11, 1984

[54] BRANCHED LABYRINTH WAFER-SCALE INTEGRATED CIRCUIT

[75] Inventor: John T. Chamberlain, Banknock, Scotland

[73] Assignee: Burroughs Corporation, Detroit, Mich.

[21] Appl. No.: 322,117

[22] Filed: Nov. 17, 1981

Related U.S. Application Data

[63] Continuation-in-part of Ser. No. 294,071, Aug. 18, 1981, abandoned.

[30] Foreign Application Priority Data

Aug. 21, 1980 [GB] United Kingdom ................ 8027213
Aug. 20, 1981 [GB] United Kingdom ................ 8125488

[51] Int. Cl.³ .......................................... G01R 31/28
[52] U.S. Cl. ........................................ 371/21; 371/11
[58] Field of Search ............................ 371/21, 10, 11; 324/73 R, 73 AT, 73 PC; 365/200, 201, 227

[56] References Cited

U.S. PATENT DOCUMENTS

| | | | |
|---|---|---|---|
| 3,475,733 | 10/1969 | Gaines et al. | 365/49 |
| 3,681,757 | 8/1972 | Allen et al. | 371/21 |
| 4,037,205 | 7/1977 | Edelberg et al. | 364/900 |
| 4,038,648 | 7/1977 | Chesley | 371/21 |
| 4,055,754 | 10/1977 | Chesley | 371/21 |
| 4,151,611 | 4/1979 | Sugawara et al. | 365/227 |
| 4,188,670 | 2/1980 | Hsia | 371/10 |
| 4,191,996 | 3/1980 | Chesley | 371/11 |
| 4,255,672 | 3/1981 | Ohno et al. | 307/455 |

FOREIGN PATENT DOCUMENTS 2311385 12/1976 France .
1337859 12/1974 United Kingdom .
1525048 9/1978 United Kingdom .
2006522 5/1979 United Kingdom .

OTHER PUBLICATIONS

Manning, An Approach to Highly-Integrated, Computer-Maintained Cellular Arrays, I.E.E.E. Trans. on Computers, vol. C-26, No. 6, Jun. 1977, pp. 536-552.
Aubusson & Catt, Wafer-Scale Integration, A Fault-Tolerant Procedure, IEEE Journal of Solid State Circuits, vol. SC-13, No. 3, Jun. 1978, pp. 339-344.
Finnila & Love, Associative Linear Array Processor, IEEE on Computers, vol. C-26, No. 2, Feb. 1977, pp. 112-125.
Egawa & Masuda, A 1Mb Full Wafer MOS RAM, IEEE Solid State Circuits Conf.: Digest of Technical Papers, Feb. 14, 1979, pp. 18-19.
Savkar, N-Way Testpoint for Complex LSI Design, IBM Technical Disclosure Bulletin, vol. 14, No. 10, Mar. 1972, pp. 2937-2938.
Self-Testing of Full Wafer Cuts Production Costs, Electronic Design, Aug. 1981, vol. 29, No. 17, pp. 35-36.

*Primary Examiner*—Charles E. Atkinson
*Attorney, Agent, or Firm*—David G. Rasmussen; Kevin R. Peterson; Edmund M. Chung

[57] ABSTRACT

A memory system includes an integrated circuit comprising a plurality of testably interconnectable cells in a tessellation on a semiconducting wafer. A controller for acting as an interface between the wafer and some host system is coupled to the wafer via a port formed by the omission of one of the cells from the tessellation. Each cell comprises plural-bit data storage registers each having an associated single-bit access register and an associated single-bit control register. During a growth phase a state machine co-operates with global signals and test data from the controller to operate data-testing and inter-register coupling logic to form a branched-labyrinth of tested cells characterized by rapid growth and efficient incorporation of functional cells. After growth data is transferred between the chain of data storage registers and the chain of access registers so formed dependently upon the contents of an associated chain of control registers. A rapid retrieval associative memory facility is incorporated allowing named data to be withdrawn on presentation of a maskable naming word to the control register chain.

9 Claims, 38 Drawing Figures

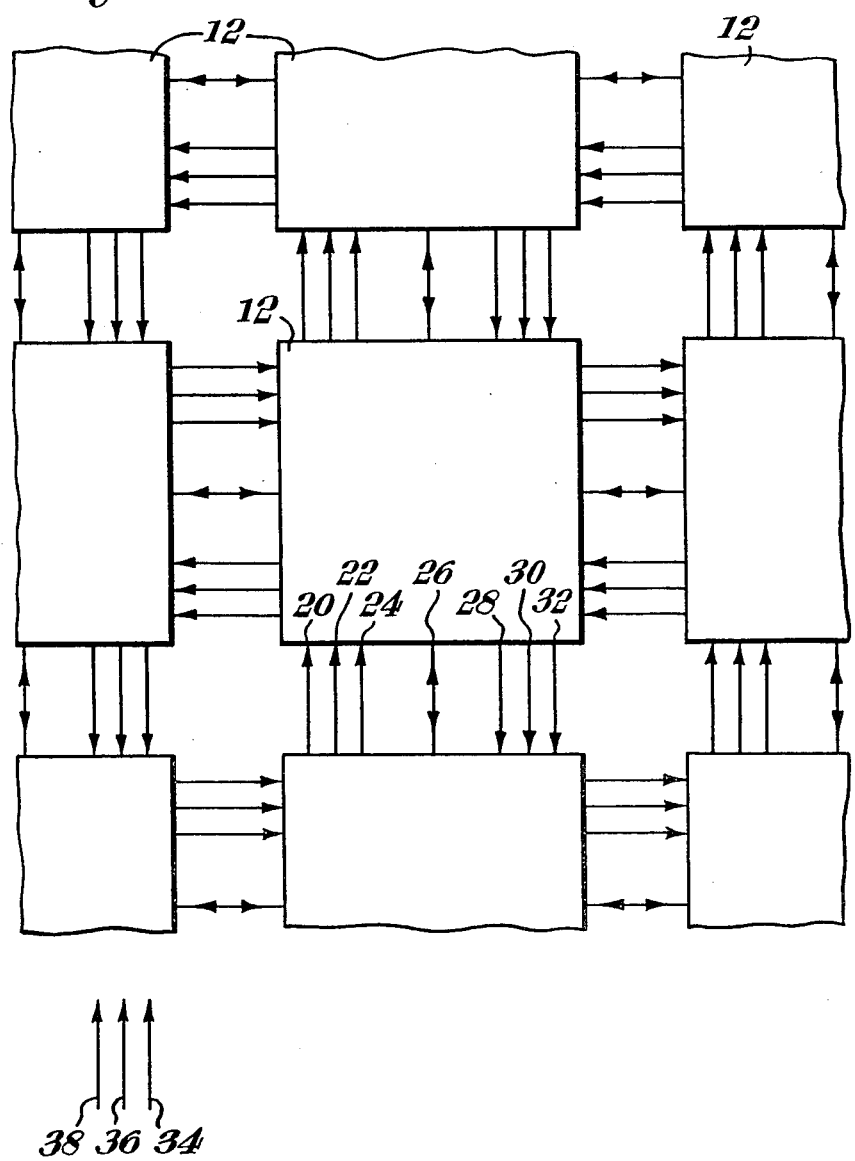

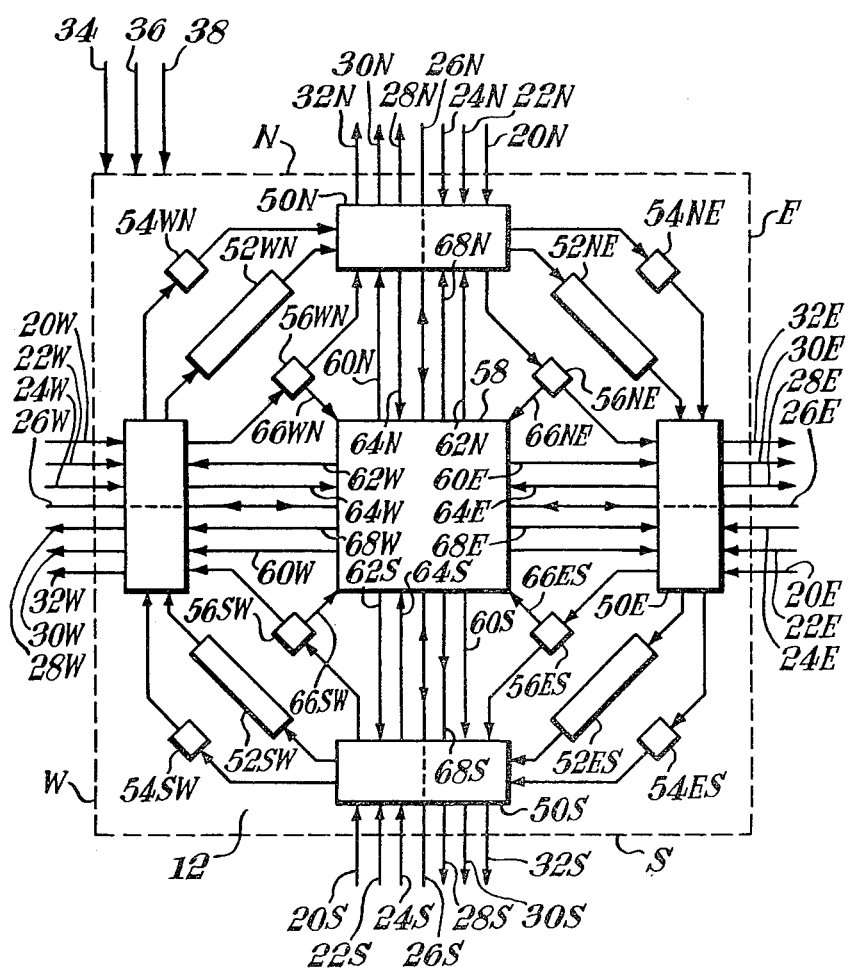

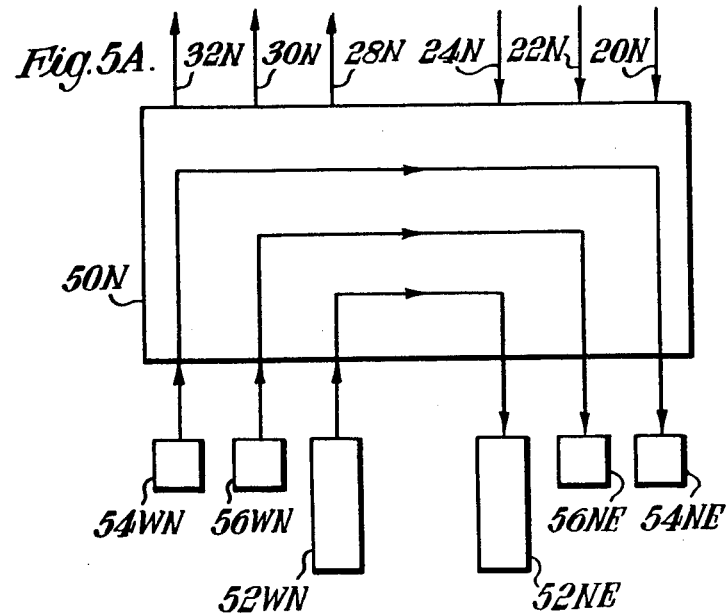
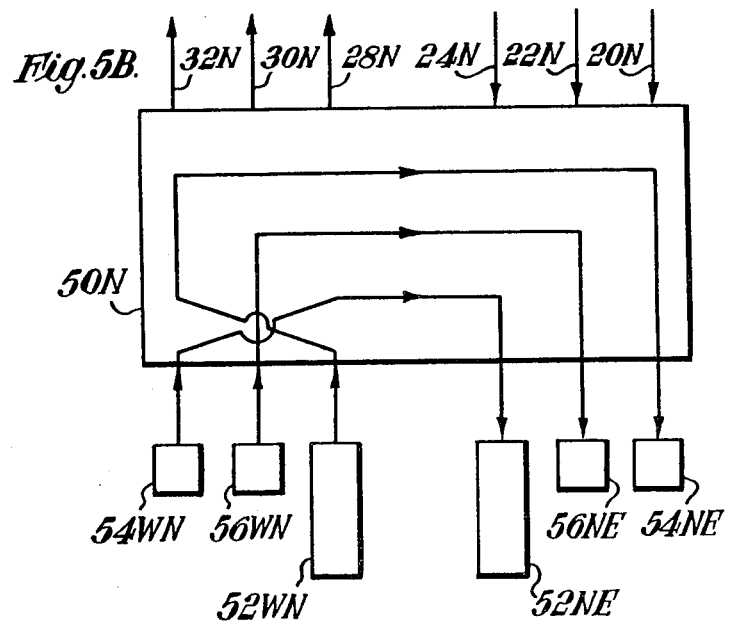

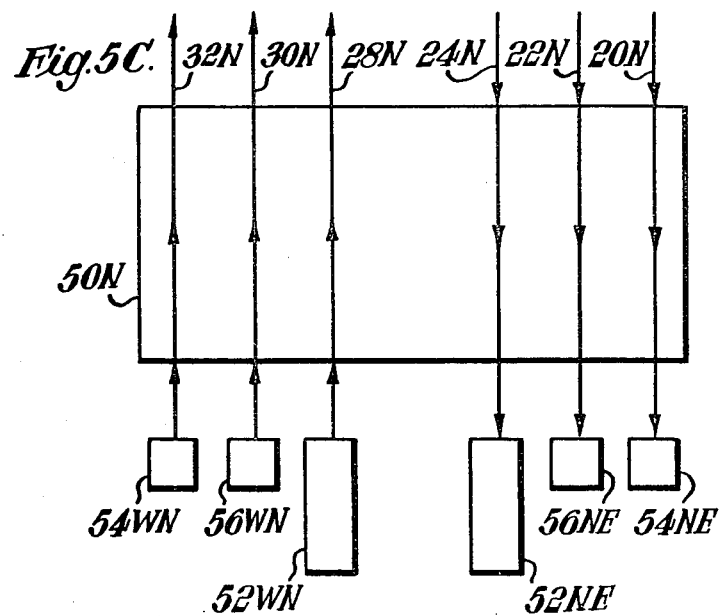
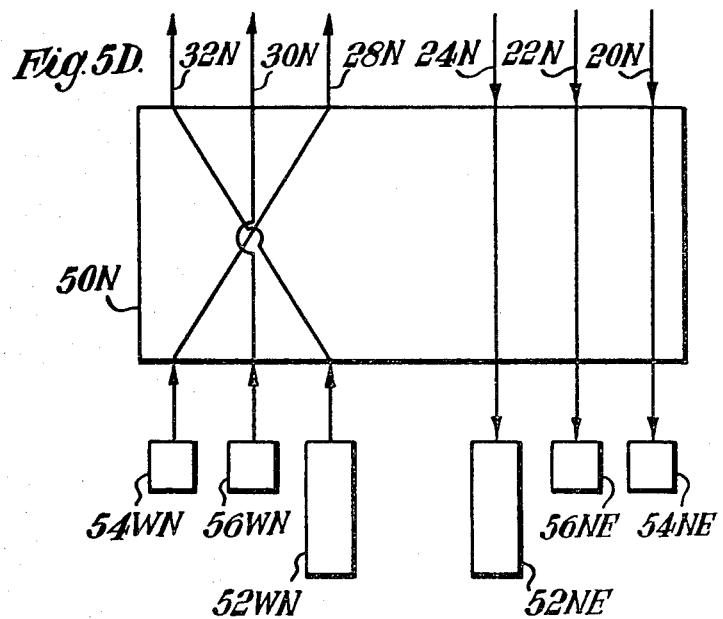

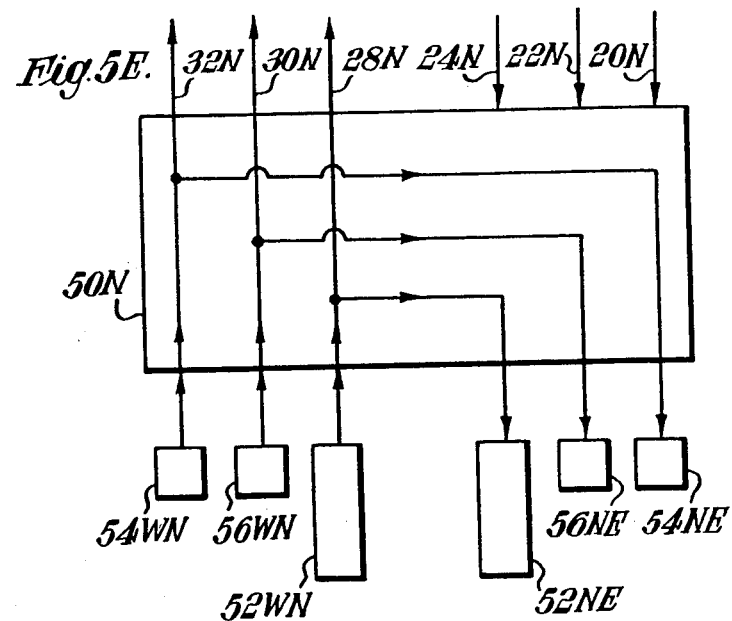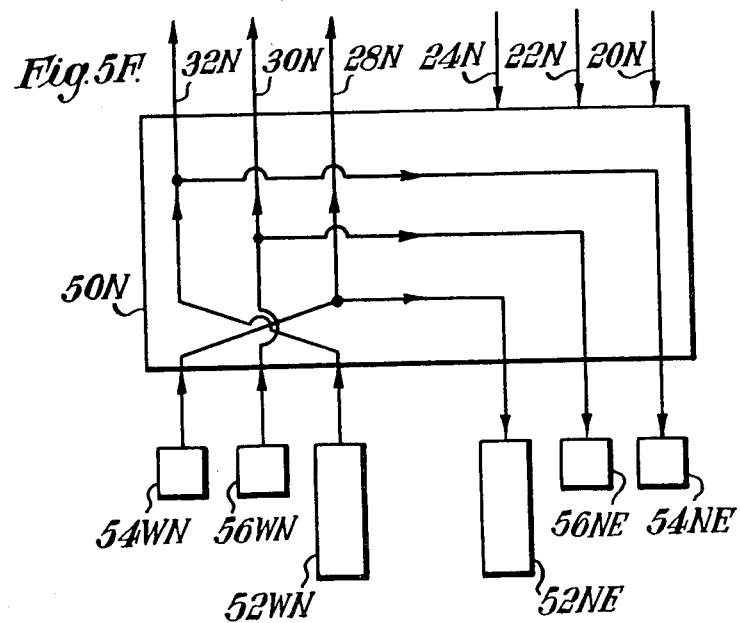

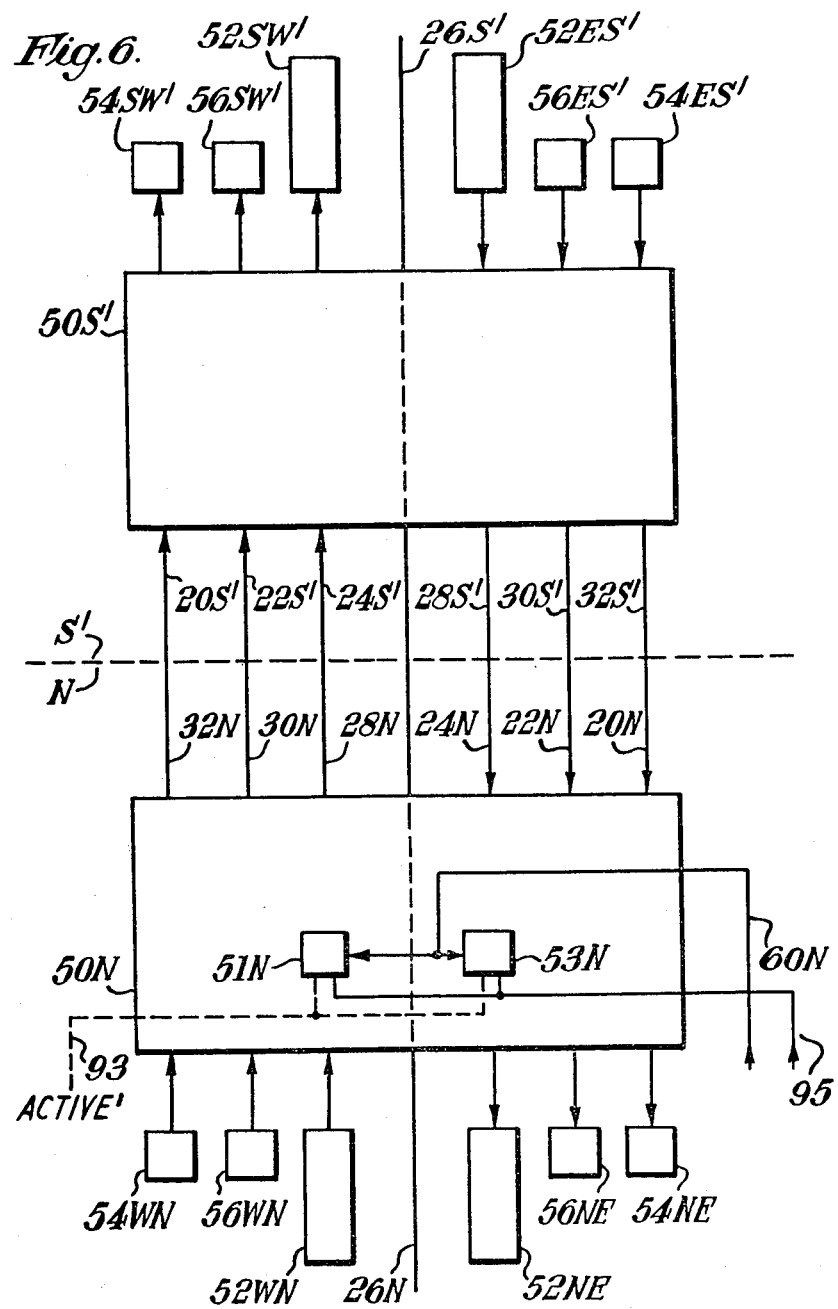

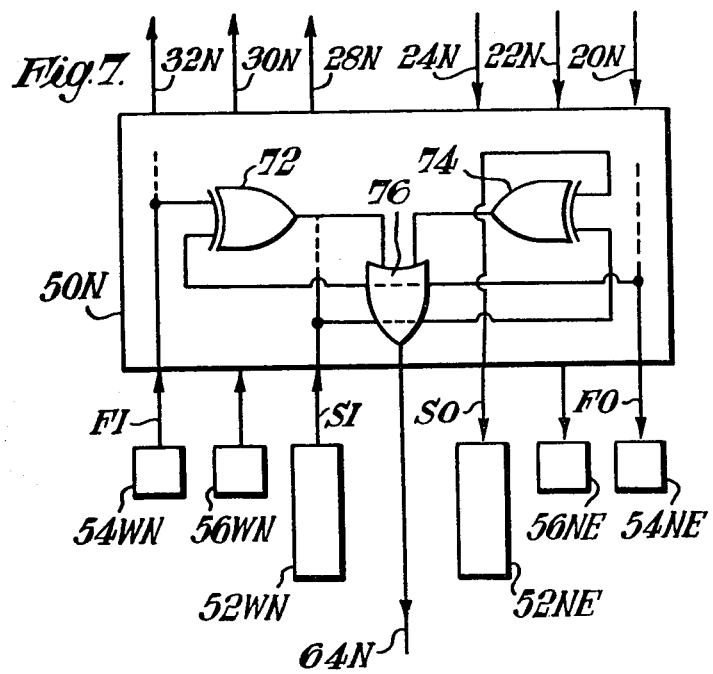
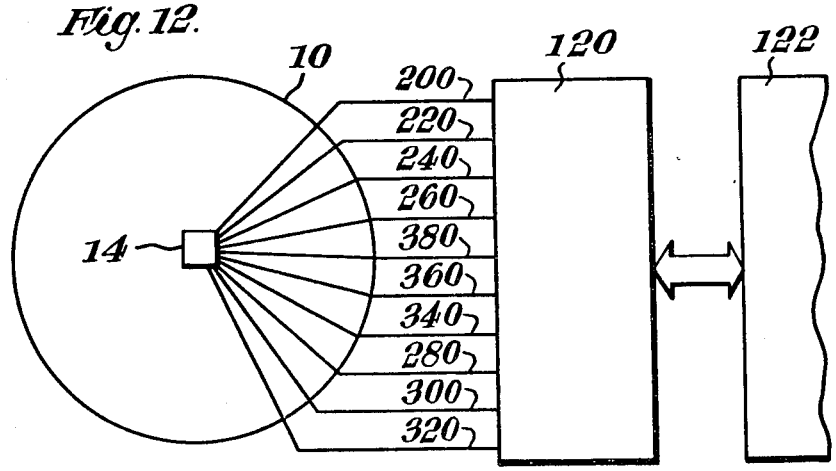

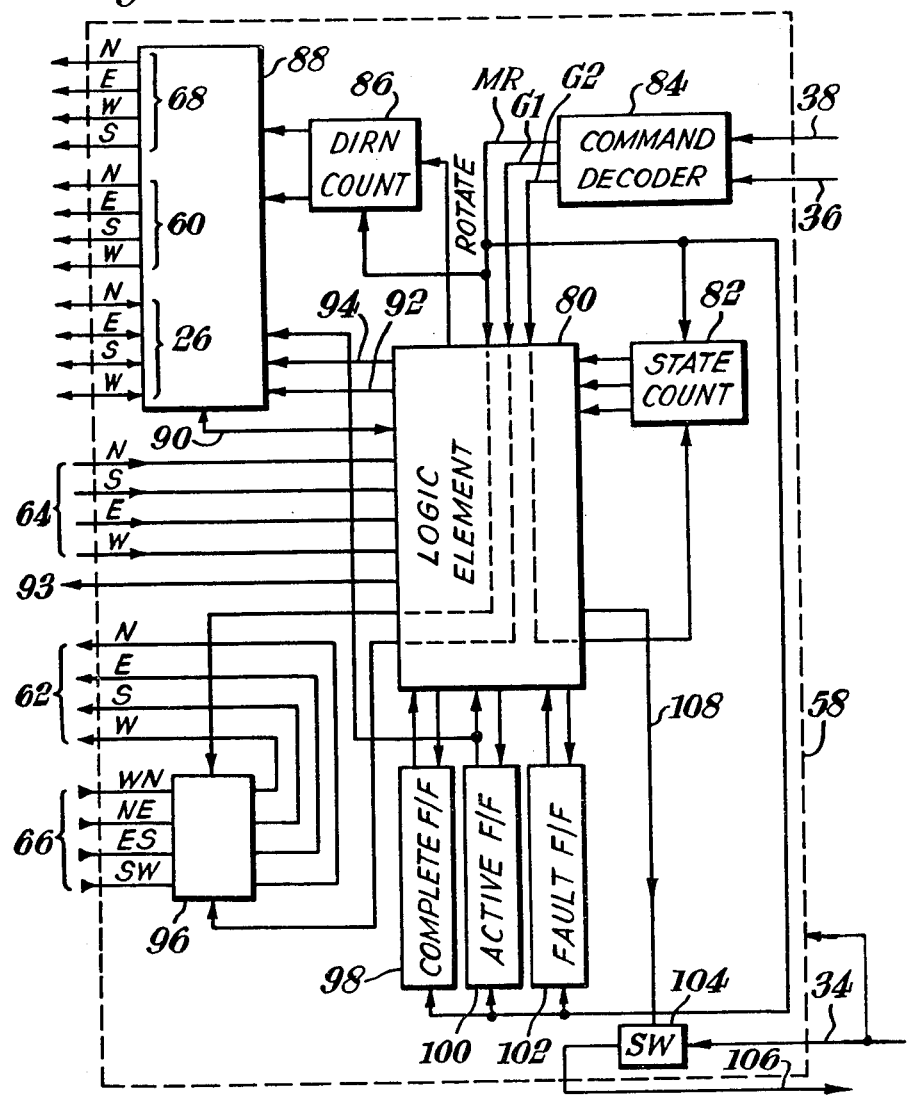

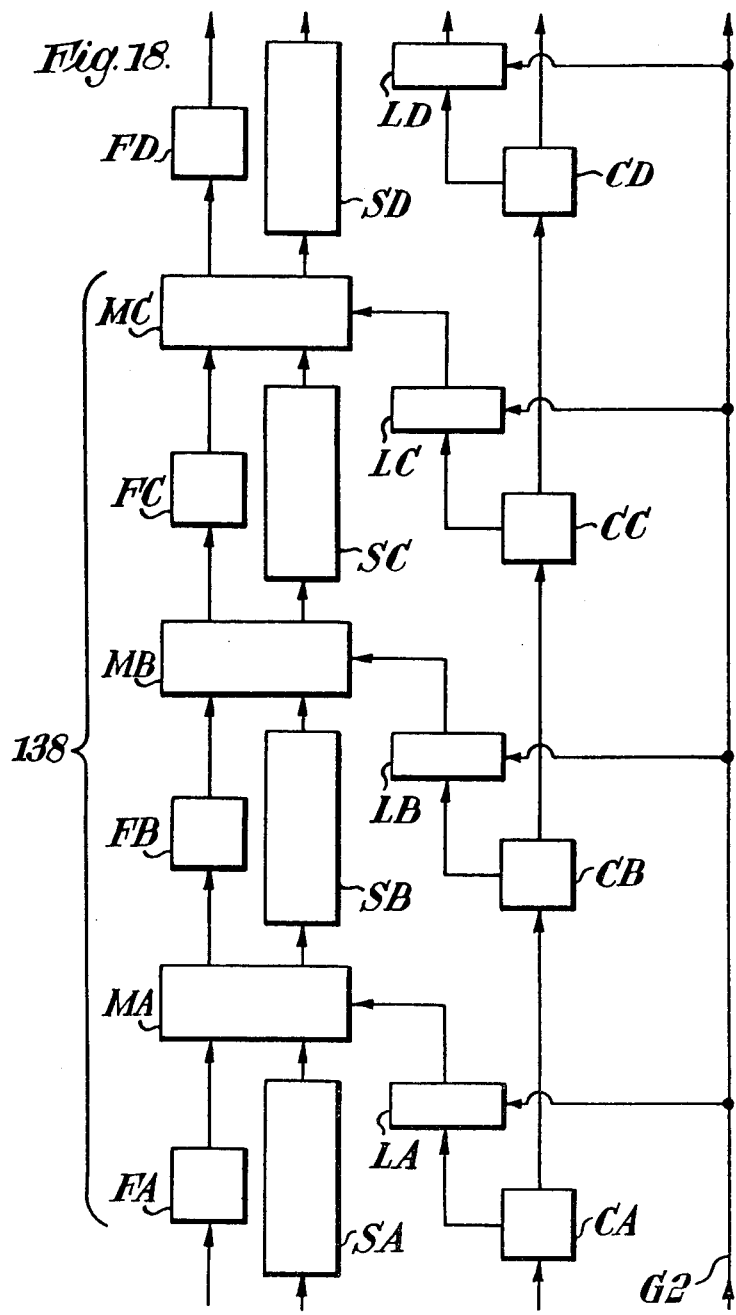

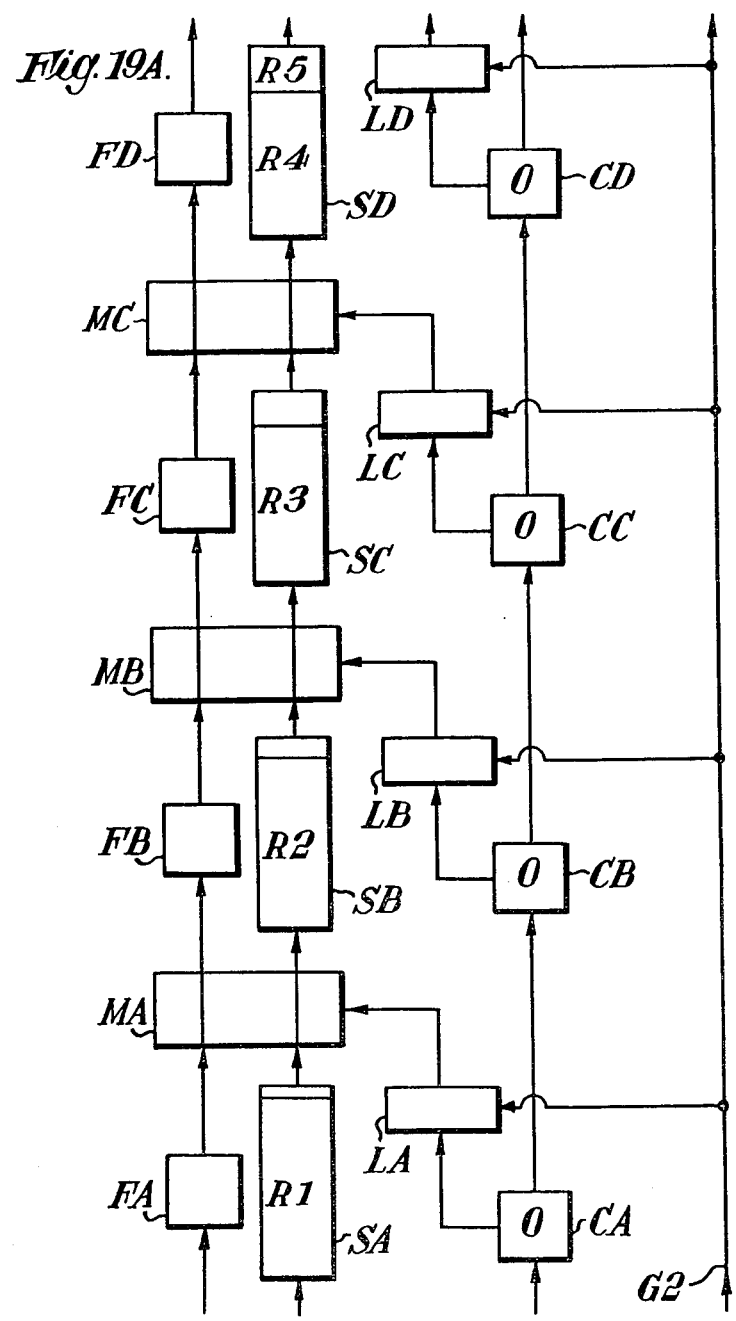

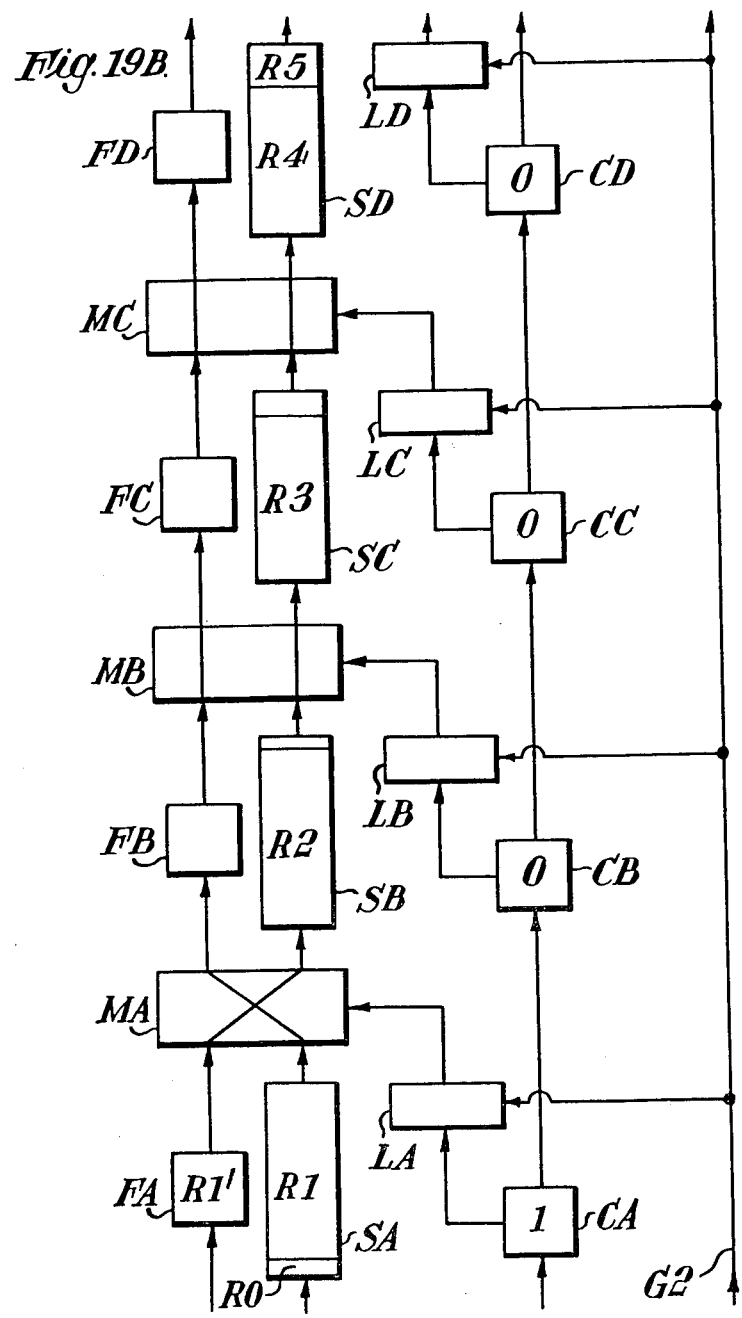

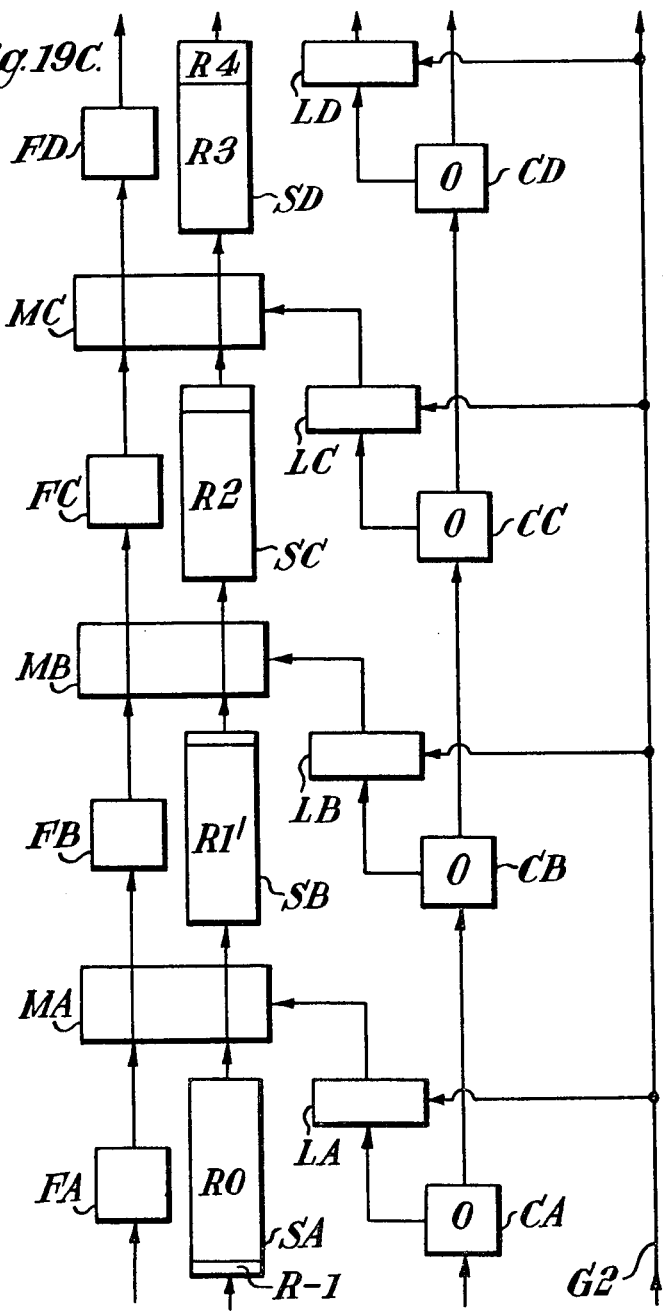

BRANCHED LABYRINTH WAFER-SCALE INTEGRATED CIRCUITSp

BACKGROUND OF THE INVENTION

This application is a continuation-in-part of application Ser. No. 294,071, filed Aug. 18, 1981, now abandoned.

This is related to the subject matter of co-pending application, Ser. No. 573,588, filed Jan. 24, 1984, whose parent is Ser. No. 293,800, (now abandoned) filed Aug. 8, 1981.

1. Field of the Invention

The present invention relates to an integrated circuit memory comprising a plurality of self-testing shift register cells operable in response to a controller to execute a test and connect routine to form a long chain, shift register branched labyrinth across the face of the integrated circuit and thereafter to store data in the long chain and to access that data via a secondary, parallel, fast chain.

2. The Prior Art

It is known to fabricate many individual circuits on a silicon wafer. The wafer is generally of the order of 6 cm in diameter and may contain many hundreds of circuits. It is the practice thereafter to cut the wafer to free each indvidual circuit, and to individually package each circuit. Integrated circuit packaging is area and volume inefficient. The package, because of clearances required for headers and leads, is many times the area and thickness of the individual circuit. The larger the circuit which can be accommodated, the more efficient the packaging becomes. As a limit, the packaging becomes more efficient when the entire wafer can be accommodated as a single circuit.

Manufacturing tolerances mean that not all of the surface of any wafer is correctly processed during integrated circuit manufacture. Areas not correctly processed yield non-working components. The likelihood of an entire wafer being fabricated as a single, working circuit is so low as to render any attempt to make such a device impractical.

It is known to fabricate an integrated circuit wafer, for use as a single device, by subdividing the wafer into plural, identical elements and providing test facilities whereby each of the elements may be tested, working elements being incorporated in the operation of the wafer and non-working elements being ignored.

Such methods include common electrical connections to each of the elements, undesirable because a failure in the common structure renders the entire wafer inoperable. Also included are methods where elements test and connect to adjacent elements of the wafer 10 across boundaries there-between, but where the percentage of working elements which are ignored by the test routine is unacceptably high.

Such whole-wafer integrated circuits are notably employed for use in data storage as memories. Typically, the individual elements contain shift registers which are connected, whenever that element is tested and found to be working, as part of a long shift register configured from the tested and working elements on the wafer. Problems exist in the slowness of data deposition or aquisition in such a structure.

A whole wafer integrated circuit is vulnerable to fabrication or operational faults which cause the power supply to individual elements therein to be short circuited. It is known to employ fusible links to isolate such elements and allow the others to continue functioning. The incorporation of fusible links introduces yet another source of possible failures, and does not allow the minimization of the power requirement of the wafer by switching off individual elements that might not be required to be incorporated in the operation of the wafer.

It is therefore desirable to provide an integrated circuit, suitable for use as a memory and for fabrication as a whole-wafer device, comprising a plurality of individual elements having the minimum of common circuitry, where the elements may be tested and incorporated into the operation of the wafer in a manner which allows for the incorporation of a high percentage of all functional elements, where the coupling of power to an element is selectable, and wherein data may be deposited or retrieved rapidly.

SUMMARY OF THE INVENTION

According to a first aspect, the invention consists in an integrated circuit comprising; a plurality of functionally testable cells, any previously untested cell being operable in response to a common control signal and an initiating signal from a neighboring cell to participate in a functional test and, if said test is passed, to be functionally coupled to said neighboring cell, and to any cell which has passed said test being capable of providing said initiating signal to a plurality of neighboring cells, and being operable, each time it receives said common control signal, to select one of said neighboring cells for provision thereto of said initiating signal, at least one of said cells being provided with means for receiving said initiating signal from, and functionally coupling to, an input error.

According to a second aspect, the invention consists in an integrated circuit comprising, a plurality of cells each cell being operable, in response to a common control signal and an initiating signal from a neighboring cell, to participate in a functional test provided it has not already done so, and, if said test is passed, to functionally couple to said neighboring cell and in response to said common control signal to provide said initiating signal to any other neighboring cell, at least one of said cells being provided with means for receiving said initiating signal from, and functionally coupling to, an input port.

According to a third aspect, the invention consists in an integrated circuit comprising; a plurality of cells interconnected to receive a common control signal from an input port, wherein at least one of said cells is connected also to receive an initiating signal from said input port, and is arranged to respond to said initiating signal to participate in a functional test, wherein, if said at least one of said cells passes said test, it is coupled functionally to said input port and responds to said common control signal to select a neighboring cell, and to supply said initiating signal to the selected neighboring cell in order to cause said neighboring cell to be tested and to be functionally coupled thereto if said selected neighboring cell passes said test, and wherein each of said cells which has passed said test is capable of providing said initiating signal to a plurality of neighboring cells and is operable each time it receives said common control signal to select one of said plurality of neighboring cells and to provide said initiating signal thereto for causing said selected neighboring cell to participate in said test provided said selected neighboring cell has not previously undergone said test, and to be functionally coupled to said selected neighboring cell if said selected neighboring cell passes said test.

According to a fourth aspect, the invention consists in an integrted circuit comprising a plurality of functionally intercouplable cells on a wafer wherein the supply of power to all of or a portion of each of said cells is conditional upon said cell being functionally coupled with another.

According to a fifth aspect, the invention consists in a data storage cell comprising, a data storage shift register, a data access shift register, a control character register and a cross-over switch, wherein said cross-over switch is operable, in response to a predetermined character being in said control character register, to cross-over the outputs of said data access register and said data storage register.

According to a sixth aspect, the invention consists in a data storage cell comprising a data storage shift register, a data access shift register, a control character shift register, a cross-over switch, and a data comparator for comparing the output of said data storage register with the output of said data access register, wherein said cross-over switch is operable when initialized by a control signal, in response to said outputs being the same, and a predetermined character being in said control character register, to cross-over the outputs of said data storage and said data access register, to maintain said crossing-over whenever said predetermined character is not in said control character register, to abandon said crossing-over if said outputs are not the same and said predetermined character is in said control character register and to maintain said abandonment until reinitialized by said control signal.

In the following description and claims functional coupling is defined as coupling for the transfer of data and/or control signals.

BRIEF DESCRIPTION OF THE PREFERRED EMBODIMENT

In a preferred embodiment an integrated circuit comprises a plurality of cells preferably on the same wafer. The cells are preferably provided with a common control signal to which each cell is operable to respond by executing a functional test, cells which have already passed the test being operable to initiate the test in any neighboring cell in a selectable direction provided the neighboring cell has not already undergone the test, and to functionally link to the neighboring cell if the neighboring cell passes the test.

The selected direction of test preferably rotates by fixed increments or decrements after each functional test cycle. The cells are preferably square, in which case the direction of test preferably decrements or increments by 90°.

The cells preferably test and interconnect to form a branched labyrinth structure over the surface of the wafer. The testing preferably starts at an input port. The tests are preferably conducted under instruction from a controller, connected at the input port.

The cells are preferably identical. The cells are preferably interconnectable to form a chain shift register memory looping once around the labyrinth.

Each cell preferably comprises a state machine for conducting the functional test supervision. The cells preferably comprise a switching matrix at each boundary edge to each neighboring cell. The matrix preferably allows that signals pass in and out of the cell when instructed in a first manner, allows signals to loop around the cell when instructed in a second manner, and allows a form of coupling required for testing when instructed in a third manner.

The chain shift register memory preferably comprises a data storage chain in parallel with a data access chain and a control character chain, together with cross-over switches operable to cross-over the data in the data storage chain and the data access chain whenever the register in the control character chain which is associated with a switch contains a predetermined character. The individual registers in the data access chain and the control character chain are preferably only one bit long.

The chain shift register memory preferably comprises a data comparison element for comparing the output of each data storage register with the output of its associated data access register and activating the cross-over switch when a data match is found and a predetermined character is in the associated control register to provide a content addressable feature.

The supply of power to each cell, whether in whole or in part, is preferably dependent upon whether or not that cell is functionally coupled to another.

The invention is further described, by way of an example, by the following description in conjunction with the appended drawings, in which:

BRIEF DESCRIPTION OF THE DRAWINGS

FIG. 2 shows the interconnections of the cells.
FIG. 4 shows details of the individual cells.
FIGS. 5A to 5F show coupling modes of the switching matrixes.
FIG. 6 shows the intercoupling between matrixes on adjacent cells.
FIG. 7 shows the data comparison facility on each matrix.
FIG. 8 shows a schematic of the state machine.
FIG. 12 shows the manner of coupling of the wafer to a host system.
FIG. 18 shows details of the shift register chain.
FIGS. 19A to 19C show the movement of data and control characters through the chain.

DETAILED DESCRIPTION OF THE PREFERRED EMBODIMENT

Figure 1:
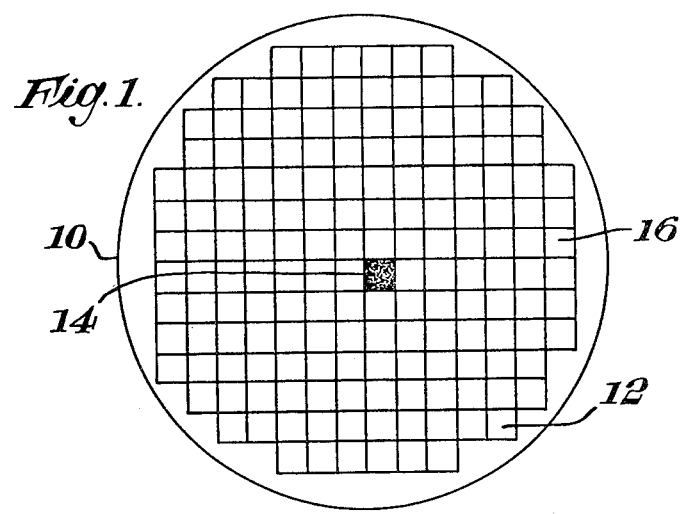
FIG. 1 shows the cells and the coupling port on the wafer.

FIG. 1 shows the cells on the wafer.
A full size silicon wafer 10 has fabricated thereon a plurality of square, contiguous, memory storage cells 12 in regular array arranged in a square tessellation. A site which could be occupied by one of the cells 12 is left blank to make a coupling port 14. Each cell 12 is operable to test a selectable one of its bordering neighbors, with the exception of the edge cells 16, which have one or more sides unbounded by a neighbor, and cannot therefore test in those directions.

FIG. 2 shows, in schematic form, the interconnections between cells 12 on the wafer 10.

Each of the cells 12 is coupled, along its boundary edges, with each of the four bordering cells. There are seven connections between bordering edges. A fast in line 20 conveys rapid data into each cell 12. A control in line 22 conveys control characters into the cell 12. A slow in line 24 conveys slow, shift register contained stored data between cells 12. A bidirectional control line 26 is used for cells 12 to signal to neighboring cells 12 along their boundaries during testing. A slow out line 28 conveys slow, shift register stored data out of each cell. A control out line 30 conveys control characters out of each cell. A fast out line 32 conveys rapid transit data out of each cell 12. In addition, every cell 12 on the wafer 10 is coupled to a power line 34, for providing D.C. power to each cell 12, a clock line 36 for conveying a common clock signal to each cell 12, and a function line 38 for conveying common commands to each cell 12. These last three lines 34, 36, 38 are known as global lines, being common to all cells 12. For clarity these lines 34, 36, 38 are not shown connected to each cell 12, but it is to be understood that a pattern of metalization carries and connects them to each cell 12 on the wafer 10.

Figure 3:
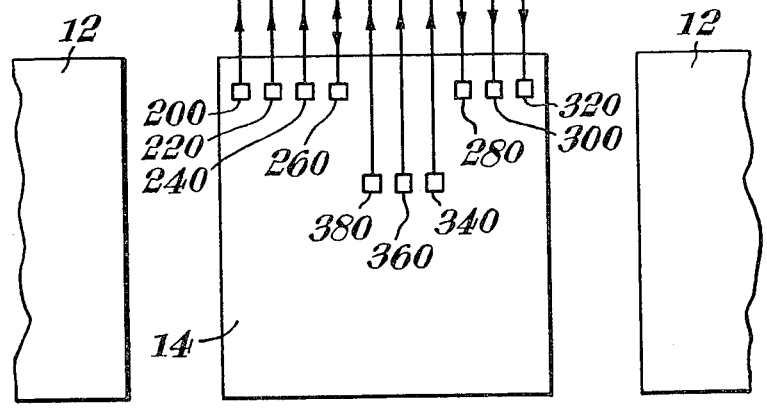
FIG. 3 shows the connections at the coupling port.

FIG. 3 shows the coupling port 14.

One edge of the coupling port 14 is provided with pads for connecting the wafer 10 to the outside world. These pads are connected by gold wire bonding in the manner normal for integrated circuit manufacture, to external connections on the wafer enclosure. The pads connect to a first cell 40 which cannot test in the direction of the pads just as the edge cells 16 cannot test into the void. A fast out pad 320 carries rapid transit data out of the wafer 10. A control out pad 300 conveys control characters out of the wafer 10. A slow out pad 280 conveys slow, shift register stored data out of the wafer 10. A power in pad 340 conveys power to each cell 12 on the wafer 10 via the power line 34. A clock input pad 360 provides an input for the common clock line 36. A command input pad 380 provides an input to the function line 38. A command line pad 260 pad 260 allows a command line signal to be linked to the first cell 40. A slow in pad 240 couples slow data into the wafer 10. A control in pad 220 couples control characters into the wafer 10. A fast in pad 200 couples rapid transit data into the wafer 10.

FIG. 4 shows details o the individual cell 12 in the polycellular array on the wafer 10.

Each cell 12 has four sides, hereinafter referred to by the points of the compass, North N, South S, East E and West W. Each of the boundaries N,E,S,W is provided with a signal switching matrix, 50N, 50E, 50S and 50W respectively, hereinafter collectively referred to as 50(NESW).

The matrixes 50 (NESW) are interconnected by four data storage shift registers 52NE, 52ES, 52SW and 52WN respectively, the first letter suffix indicating the matrix 50 of origin and the second letter of the suffix indicating the matrix 50 of destination. The length of the shift registers 52 is immaterial to the operation of the present invention. In the particular case of the preferred embodiment they are 360 bits long. The shift registers 52NE, 52ES, 52SW and 52WN represent the data storage capacity of the cell 12.

The matrixes 50 (NESW) are similarly interconnected by four single bit fast registers 54NE, 54ES, 54SW and 54WN respectively, the letter suffixes having the same meaning as before. In just the same manner, four single bit control registers 56NE, 56ES, 56SW and 56WN are interconnected between the matrixes 50 (NESW) with the letter suffixes yet again indciating the same information.

A state machine 58 controls the matrixes 50 (NESW) via connect signals on connect command couplings, one to each matrix 60N, 60E, 60S and 60W respectively, and cross-over signals on cross-over couplings 62N, 62E, 62S and 62W respectively. The state machine 58 is responsive to and operable to provide signals on the command lines 26N, 26E, 26S and 26W, these being the lines used to signal between adjacent state machines 58 in the polycellular array.

The power line 34, is coupled to every element in the cell 12, via the state machine 58, the clock line 36 is coupled to every element in the cell 12, and the function line 38 is coupled to the state machine 58.

Each of the matrixes 50 (NESW) contains a comparison element for bit-by-bit comparisons of incoming and outgoing data. The detection of an error in the comparison is signalled to the state machine 58 via the error couplings 64N, 64E, 64S and 64W.

The state machine is responsive to the contents of the control shift registers 56NE, 56ES, 56SW and 56WN and is coupled thereto via the control couplings 66NE, 66ES, 66SW and 66WN respectively.

When the state machine 58 provides the connect signal to any one of the matrixes 50N, 50E, 50S or 50W that matrix couples the contents of its incoming fast register 54WN, 54NE, 54ES or 54SW respectively, into the fast out line 32N, 32E, 32S or 32W respectively and couples the contents of the incoming control register 56WN, 56NE, 56ES or 56SW respectively into the control out line 30N, 30E, 30S or 30W respectively, couples the output of the incoming slow register 52WN, 52NE, 52ES or 52SW respectively into the slow out line 28N, 28E,28S, or 28W respectively couples the data arriving on the slow in line 24N, 24E, 24S or 24W respectively as the input to the outgoing shift register 52NE, 52ES, 52SW or 52WN respectively, couples the control bits arriving on the control in line 22N, 22E, 22S or 22W respectively to the outgoing control register 56NE, 56ES, 56SW or 56WN respectively, and couples the data arriving on the fast in line 20N, 20E, 20S or 20W respectively as the input to the outgoing fast register 54NE, 54ES, 54SW or 54WN respectively.

When the state machine 58 does not provide the connect command to one of the matrixes 50N, 50E, 50S or 50W, that matrix couples the output of the incoming slow register 52WN, 52NE, 52ES or 52SW respectively as the input to the outgoing slow register 52NE, 52ES, 52SW or 52WN respectively, couples the output of the incoming fast register 54WN, 54NE, 54ES or 54SW respectively as the input to the outgoing fast register 54NE, 54ES, 54SW or 54WN respectively, and couples the output of the incoming control register 56WN, 56NE, 56ES or 56SW respectively as 'the input to the outgoing control register 56NE, 56ES, 56SW or 56WN respectively.

Notwithstanding the above, whenever the state machine provides the cross-over command to any one of the matrixes 50N, 50E, 50S, or 50W, should the state machine 58 also be providing the connect command, that matrix 50N, 50E, 50S or 50W changes its function from the foregoing by coupling the output of the incoming slow register 52WN, 52NE, 52ES or 52SW respectively into the fast out line 32N, 32E, 32S or 32W respectively, coupling the output of the incoming fast register 54WN, 54NE, 54ES or 54SW respectively into the slow out line 28N, 28E, 28S or 28W respectively, coupling the data on the slow in line 24N, 24E, 24S or 24W respectively as the input to the outgoing fast register 54NE, 54ES, 54SW or 54WN respectively, and coupling the data on the fast in line 20N, 20E, 20S or 20W respectively as the input to the outgoing slow register 52NE, 52ES, 52SW or 52WN, and should the state machine 58 not be providing the connect command, that matrix 50N, 50E, 50S or 50W changes its function by coupling the output of the incoming slow register 52WN, 52NE, 52ES or 52SW respectively as the input to the outgoing fast register 54NE, 54ES 54SW or 54WN respectively and coupling the output of the incoming fast register 54WN, 54NE, 54ES or 54SW respectively as the input to the outgoing slow register 52NE, 52ES, 52SW or 52WN respectively.

The state machine 58 further provides, to the matrixes 50N, 50E, 50S and 50W, a test signal via the test connectors 68N, 68E, 68S and 68W respectively. Whenever a matrix 50N, 50E, 50S or 50W is in receipt of the test signal it responds by coupling the output of the incoming control register 56WN, 56NE, 56ES or 56SW respectively as the input to the outgoing control register 56NE, 56ES, 56SW or 56WN respectively and as the input to the control out line 30N, 30E, 30S or 30W respectively, couples the output of the incoming fast register 54WN, 54NE, 54ES or 54SW respectively as the input to the outgoing fast register 54NE, 54ES, 54SW or 54WN respectively and as the input to the fast out line 32N, 32E, 32S or 32W respectively, and couples the output of the incoming slow register 52WN, 52NE, 52ES or 52SW respectively as the input to the outgoing slow register 52NE, 52ES, 52SW or 52WN respectively, and as the input to the slow out line 28N, 28E, 28S or 28W respectively, while still responding to the cross-over instruction to swap the fast and slow data whenever the state machine 58 provides the cross-over instruction.

FIGS. 5A through 5F show the coupling function of the North matrix 50N is schematic form, it being understood that the other three matrixes 50E, 50S and 50W function in the same manner.

FIG. 5A shows the situation where the matrix 50N is in receipt of neither the cross-over instruction, the connect instruction nor the test signal.

FIG. 5B shows the situation where the matrix 50N is in receipt of neither the connect instruction nor the test signal but is in receipt of the cross-over command.

FIG. 5C shows the situation where the matrix 50N is in receipt of the connect command.

FIG. 5D shows the situation where the matrix 50N is in receipt of both the connect command and the cross-over command.

FIG. 5E shows the situation when the matrix is in receipt of the test signal.

FIG. 5F shows the situation where the matrix 50N is in receipt of both the test signal and the cross-over command.

FIG. 6 shows, in schematic detail, the intercoupling across the Northern edge N of the cell 12, it being understood that the intercoupling across the three remaining edges E,S and W is the same. A flip-flop, the CON F/F 51N is set by the application of either the test command or the connect command and an establish connection signal on the connector 93. The output of CON F/F 51N is used to maintain the permanent coupling across the boundary N to the adjacent matrix 50S, consistently with FIGS. 5C and 5D, when either the test command or the connect command is removed by state machine 58 after determining that such a permanent connection should be established. The flip-flop 51N is rest by a master reset signal on the connector 95.

The superscript on any number or letter is indicative of the part indicated by that number or letter being a member of the adjacent cell.

The fast out line 32N couples to the fast in line 20S' of the adjacent cell. The control out line 30N couples to the control in line 22S' of the adjacent cell. The slow out line 28N couples to the slow in line 24S' of the adjacent cell. The command line 26N couples to the command line 26S' of the adjacent cell. The fast out line 32S' of the adjacent cell couples to the fast in line 20N. The control out line 30S' of the adjacent cell couples to the control in line 22N. The slow out line 28S' of the adjacent cell couples to the slow in line 24N. These intercouplings allow adjacent state machines 58 to signal to one another via the command lines 26, and allow the transfer of data and control characters between corresponding registers in adjacent cells. In a similar manner, the Eastern face E would couple to an adjacent Western face W', the Southern face S would couple to an adjacent Northern face N', and the Western face W would couple to an adjacent Eastern face E'.

FIG. 7 shows the manner in which the Northern matrix 50N detects and signals errors to the state machine 58, it being understood that the other three matrices 50E, 50S and 50W function in the same manner.

A first EXCLUSIVE OR gate 72 monitors the data arriving on the incoming fast in line 20N and going to the outgoing fast out line 32N. If the two data bits so presented are not the same, an error is indicated and the first EXCLUSIVE OR gate 72 provides a logically true output. In the same manner, a second EXCLUSIVE OR gate 74 monitors the data going out on the outgoing slow out line 28N and the data arriving on the incoming slow in line 24N and provides a logically true output if the data bits so delivered are not the same. The output of the first and second EXCLUSIVE OR gates 72 and 74 are logically combined by an or gate 76 whose output provides a logically true error indication on the error coupling 64N in the event of either data mismatch as described.

FIG. 8 shows, in schematic form, the elements and intercouplings of the state machine 58.

The state machine 58 comprises a logic network 80 which is control and next state logic under the command of a three bit state counter 82. The state counter 82 and the logic element 80 together form a sequential logic state machine having eight main states designated 0 to 7 inclusively and six subsidiary states 0' to 5' inclusively. A command decoder 84 receives the clock signal from the clock line 36 and the common command signal from the function line 38 and decodes them in a manner explained below to provide a master reset signal MR, a first global signal G1 and a second global signal G2, all three used for the control of the state machine 58.

A two bit direction counter 86 provides a two binary digit, steering output to a selection gate 88. The selection gate, 88, in response to the output of the counter 86 steers the common command line 90 onto a selected one of the command lines 26N, 26E, 26S or 26W, steers the common connect line 92 onto a selected one of the connect lines 60N, 60E, 60S or 60W, and steers the common test line 94 onto a selected one of the test lines 68N, 68E, 68S or 68W. The direction counter 86 is incremented by a G1 signal when the state machine 58 is in state 0 and reset by the MR signal.

A 4 bit latch 96 receives the contents of the control registers 56WN, 56NE, 56ES and 56SW via the control couplings 66WN, 66NE, 66ES and 66SW and latches them, in response to a G2 signal, to the cross-over couplings 62N, 62E, 62S and 62W respectively, the latch 96 being rest with its outputs zero by a MR signal.

The logic element 80 receives and is responsive to the error indications on the error couplings 64N, 64E, 64S and 64W.

The logic element 80 is operable to set and reset, and respond to the states of a complete flip-flop 98, an active flip-flop 100 and a fault flip-flop 102. The selection gate 88 is also responsive to the state of the active flip-flop 100 in determining the direction in which to steer its input signals.

Power enters the state machine 58 via the power line 34. Power is permanently connected to the state machine 58. Power to all other elements in the cell 12 is regulated by a series switch 104 which is sensitive to excess current and switches off power to the rest of the cell 12 via the cell power line 106 in the event of excessive consumption. The switch 104 is also operable, in response to a switch command from the logic element 80 via the switch coupling 108, to selectably remove or supply power to the cell 12.

The state machine 58 responds to the global commands G1, G2 to test adjacent cells and incorporate them into a memory system should they prove working. Starting at the coupling port 14 the first cell 40 is tested by a controller whose details are given below, and if found good, is accepted into the system and itself becomes a tester for the next cell 12. The direction of test is rotated by 90° at each stage, so that the labyrinth of connected cells developes branches.

FIGS. 9A to 9L illustrate the action of the interconnect method on a perfect wafer 10 having no nonfunctional cells thereon. The direction of test is indicated by the arrow 112 next to the labyrinth 110. It is assumed that the interconnections to the outside world on the coupling port 14 are on its south side and that the rotation of direction follows the order SWNE repeatedly from FIGS. 9A to 9L. It is seen that the labyrinth grows at a rate which increases with size, and all cells are incorporated.

Figure 9A:
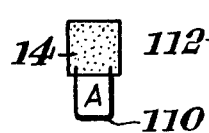
FIGS. 9A to 9L show the growth of the labyrinth.
Figure 9B:
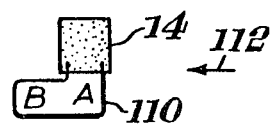
Figure 9C:
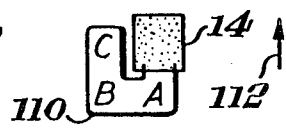
Figure 9D:
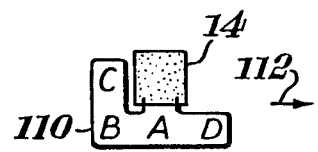
Figure 9E:
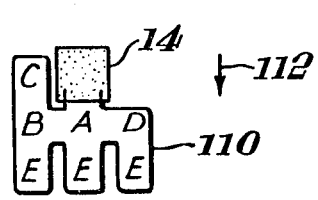
Figure 9F:
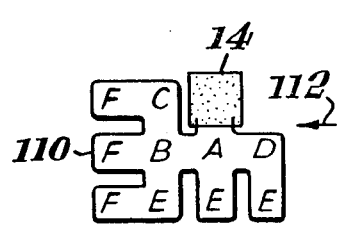
Figure 9G:
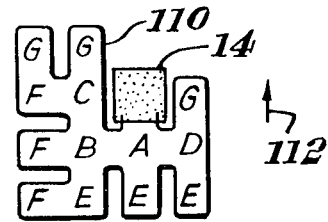
Figure 9H:
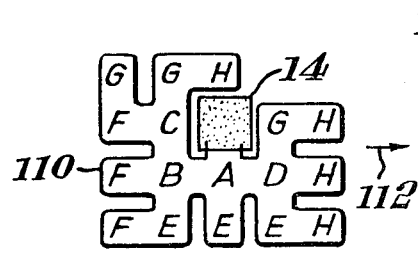
Figure 9I:
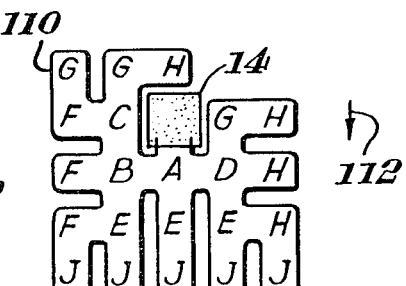
Figure 9J:
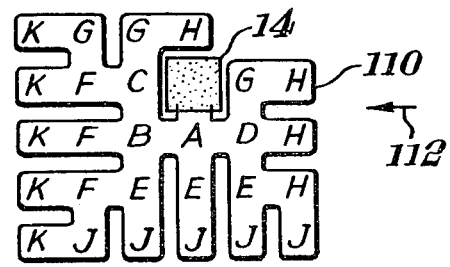
Figure 9K:
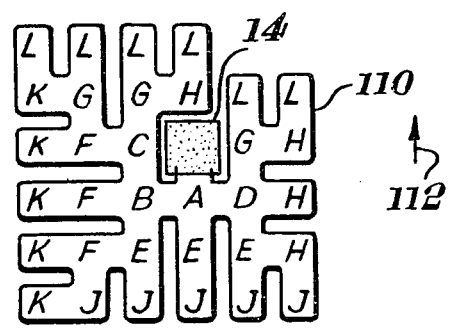
Figure 9L:
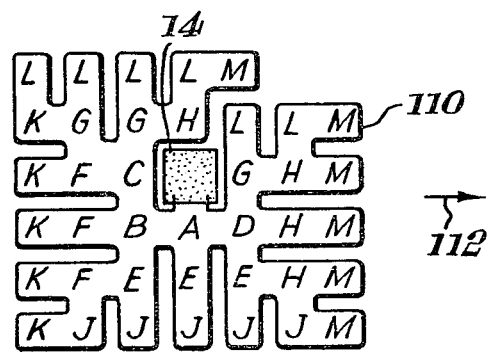

The controller 120 (FIGS. 12 and 13) firstly tests in the south direction and incorporates a first cell A, as shown in FIG. 9A. Having incorporated the first cell A the controller 120, as shown in FIG. 9B, commands the first cell A to test in a westerly direction whereupon the first cell A incorporates by linking thereto, a second cell B. In FIG. 9C the controller 120 commands the first and second cells A, B to test in a northerly direction. The first cell A tries to test the hole 14, but obtains no response. The second cell B picks up a third cell C. FIG. 9D shows the controller 120 commanding the first, second and third cells A, B, C to test in an easterly direction. The third cell C tries to test the hole 14 but cannot do so. The second cell B is inhibited from testing the first cell A, because it has already undergone the test, but the first cell A picks up a fourth cell D. FIG. 9E shows the controller 120 commanding all incorporated cells A, B, C, D to test in a southerly direction. The third cell C tries to but cannot test the second cell B as the second cell is already incorporated. The first, second and fourth cells each pick up one fifth cell E. FIG. 9F shows the controller 120 commanding all of the incorporated cells A,B, C, D, E to test the adjacent cell in the westerly direction. The first, fourth and two of the fifth cells A, D and E are unable to pick up an adjacent cell as the cell adjacent thereto is already incorporated, but the second cell B, the third cell C and one of the fifth cells E each manage to pick up sixth cells F. FIG. 9G shows all incorporated cells testing in a northerly direction and all cells free to do so picking up three sixth cells G. In FIGS. 9H to 9L all cells thus far incorporated at each stage test firstly in an easterly direction then in a southerly, westerly, northerly and again in an easterly direction respectively, incorporating seventh cells H, then eight cells J, ninth cells K, tenth cells L and eleventh cells M wherever the cell adjacent to another is free to be incorporated. This process may be continued until the entire wafer 10 is used up. Cells 16 at the edge of the tessellation obviously cannot link other than into the tessellation.

Figure 10:
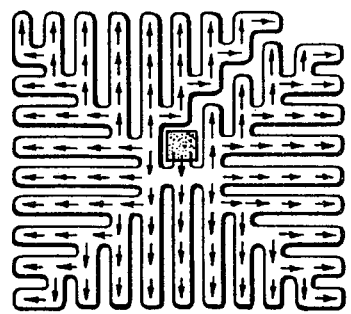
FIG. 10 shows a labyrinth at an advanced growth stage.

FIG. 10 shows the labyrinth growth of FIG. 9A to 9K taken to a total of 20 stages. The pattern of interconnection so obtained is apparent.

Figure 11:
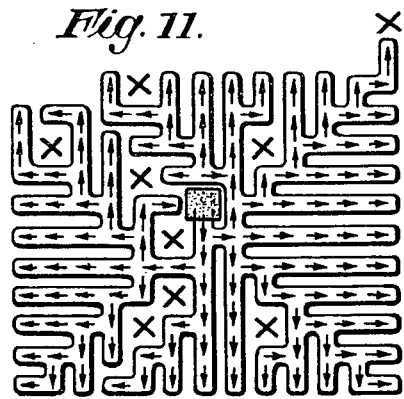
FIG. 11 shows an advanced-growth labyrinth on a wafer with inoperative cells.

FIG. 11 shows the result of a 20 stage growth cycle, executed in the same manner as the growth cycle of FIG. 10, but on a wafer with defective cells which are rejected for incorporation and indicated by crosses. It is seen that all good cells around the defective cells are incorporated. That is not to say that patterns of defective cells do not exist which prohibit the incorporation of some working cells, but in general a very high percentage of working cells will be picked up.

The command decoder 84 generates the global signals G1, G2 and the master reset MR signal from the clock signal and the function signal in the manner indicated by table 1 below. It is to be appreciated that the clock signal is a 50% mark to space ratio repetitive clock of fixed period. The decoder 84 operates on the clock signal by means of gates and binary dividers to generate two separate 2-phase clock signals, C1 and C2 each of which comprises every alternate logically true portion of the clock signal, in a manner well known in the art. Such division leaves an indeterminacy as to which of the C1 and C2 signals occurs first. A method is therefore provided to rectify this deficiency, as shown in Table 1.

TABLE 1

| FUNCTION | CLOCK | RESPONSE |
|---|---|---|
| 0 | 0 | No action |
| 0 | 1 | No action |
| 1 | 1 | If function went true immediately prior to C1 going true; then this indicates G1. If function went true immediately prior to C2 going true, then this indicates G2. |
| 1 | 0 | MASTER RESET (MR). To synchronise clock, take first clock after this to be C2. |

1 = logically true
0 = logically false

The state counter 82 operates in a simple Gray code. If the outputs of the counter 82 are indicated by A1, A2 and A3, then the counter operates as indicated in table 2 below.

TABLE 2

| A1 | A2 | A3 | STATE |
|----|----|----|-------|
| 0  | 0  | 0  | 0     |
| 0  | 0  | 1  | 1     |
| 0  | 1  | 1  | 2     |
| 0  | 1  | 0  | 3     |
| 1  | 1  | 0  | 4     |
| 1  | 1  | 1  | 5     |
| 1  | 0  | 1  | 6     |
| 1  | 0  | 0  | 7     |

The direction counter 86 operates in the manner indicated by table 3 below. When ACTIVE 100 is set the particular cell is a tester and the test coupling 68 is activated in the appropriate direction. Otherwise, with ACTIVE 100 reset, the cell is subject to testing and connect coupling 60 is activated.

TABLE 3

| COUNT | ACTIVE | ACTIVE |
|-------|--------|--------|
| 00    | SOUTH  | NORTH  |
| 01    | WEST   | EAST   |
| 11    | NORTH  | SOUTH  |
| 10    | EAST   | WEST   |

FIG. 12 shows the manner of connection of the wafer 10 when employed as a memory.

The wafer 10 is coupled, via the pads of FIG. 3 on the coupling port 14, to a controller 120. The controller 120 is operable to execute a test and growth sequence of commands to the wafer 10 and thereafter to supervise the deposition and retrieval of data in the now established and tested memory. The controller 120 is mutually coupled to a host system, such as a data processor 122. The controller 120 provides indication to the host 122 when the memory has been tested and established enabling the host 122 to commence to use it. The size of the memory to be established is either defined by the host 122 signalling to the controller 120, or is a predetermined feature of the controller 120.

During the growth phase, the controller 120 issues the operational signals, the first Global signal, hereinafter referred to as G1, the second Global signal, hereinafter referred to as G2 and the Master reset signal, hereinafter referred to as MR to the wafer 10, coded on clock and function lines and between issuing signals runs in test patterns of fast data, slow data and control characters to test the overall memory loop for errors and in particular to test those cells 12 which are first being coupled into the overall circuit. The checking for errors takes place partly within the controller 120 and partly within the cells 12 themselves.

As far as the coupling port 14 is concerned, the controller 120 looks and behaves just like a cell 12 already incorporated into the circuit. The controller, when testing the first cell 40, behaves just as the first cell 40 behaves when testing a following cell 12, after the first cell 40 has been incorporated into the circuit.

During the growth phase, cells are distinguished by the state of the ACTIVE flip-flop 100, those cells 12 where it is set being tester cells and cells 12 where it is not set and adjacent in the direction of test to a tester cell being subject cells.

The controller 120 first issues the master reset signal MR to all cells 12 on the wafer, so resetting all counters and latches and putting the state machine 58 into state 0. This master reset (MR) is used only when testing the first cell 40, the state machine usually being set into state 0 by a G1 signal being applied when it is in state 7, as described below. The controller 120 then issues, with the state machine in state 0, a G1 signal, which has the effect of incrementing the direction counter 86 and setting the state machine 58 into state 1. The G1 signal is gated by the state machine 58 such that it reaches the direction counter 86 only when the state machine 58 is in state 0. The gated G1 signal is called the ROTATE signal. The effect of incrementing the direction counter is to swing the direction of test by ninety degrees.

Figure 13:
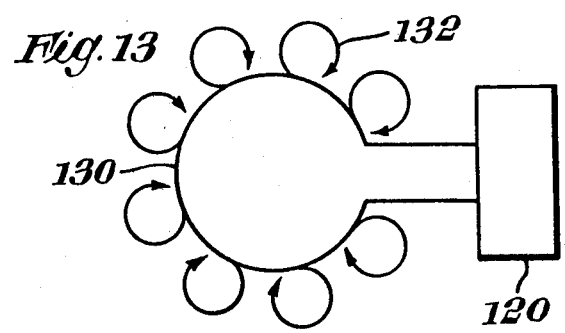
FIG. 13 shows the path of data and control characters during cell test.

FIG. 13 shows the effect, in schematic form, of the action taken by the controller 120 while the state machine 58 is in state 1.

When in state 1 all tester cells 130 place the test signal on the test coupling 68N, 68E, 68S or 68W in the direction of test, and the signal on their command lines 26N, 26E, 26W or 26S, in the direction of test. The subject cells 132 may now be filled with data and control characters which they are not able to pass back into the tester cells 130. The controller 120 runs all ones into the control in pad 220, and knows when all of the subject cells 132 and the tester cells 130 are full when the all ones pattern reappears at the control out pad 300. Receipt of the command signal by the subject cell 132 causes its logic element 80 to switch on power to the registers and matrixes 52, 54, 56, 50 via the switch 104.

The controller then issues a G2 signal to all of the cells 12, which has the effect of coupling all of the contents of control registers 56WN, 56NE, 56ES and 56SW, already filled with all ones, to the cross-over connections 62N, 62E, 62S and 62W respectively, and so setting all the matrixes 50N, 50E, 50S and 50W into the cross-over mode.

Figure 14:
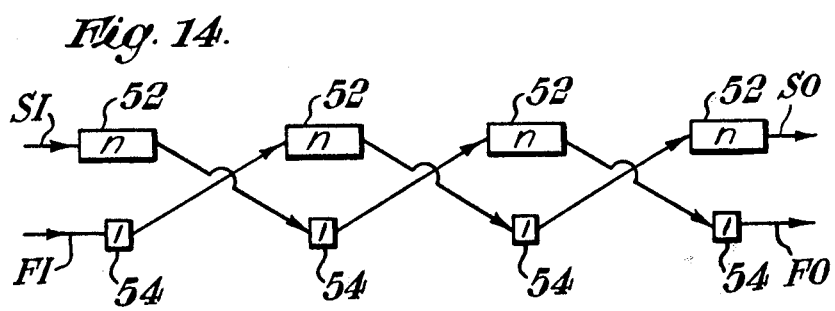
FIG. 14 shows the test pattern path through a cell during a first part of the test.

FIG. 14 shows the situation achieved, in terms of fast and slow register 52, 54 interconnection, by this last operation.

Every cell 12 is in the condition indicated, whether it be a tester or a subject. The one bit long fast registers 54, hereinafter described without their former suffix, and the slow registers 52, hereinafter also described without their suffix, form two chains passing between the slow in SI line from the incoming matrix to the slow out line SO back to the incoming matrix, and between the fast in line FI from the incoming matrix to the fast out line FO back to the incoming matrix. If the slow registers are n bits long, then the total length of each path is 2n+2 bits. The controller 120 then administers identical patterns to the fast in pad 200 and to the slow in pad 240, the patterns consisting of pseudo-random sequences each 2n+2 bits long so that the signal at SI is the same as the signal at SO and the signal at FI is the same as the signal at FO. The controller 120 does this until it sees the patterns returning and knows that it has filled the fast 54 and slow 52 registers.

Each state machine 58 watches the output of the input matrix error line 64N, 64S, 64E or 64W. It takes at least 2n+2 clock cycles before any match on any cell can be obtained. The error line 64N, 64S, 64E or 64W, hereinafter referred to without its suffix as 64, must show an initial fault indication, in response to which the logic element should set the fault flip-flop 102. If the fault flip-flop 102 is not set, the cell 12 is incapable of detecting errors and is therefore inhibited from passing into state 2 of the state machine 58 as it is incapable of testing neighboring cells. The cell is frozen in state 1, in which frozen state the logic element 80 commands the switch 104 to remote power from the registers.

All cells, both testers and subjects change to the next state on receipt of the appropriate global signals, provided no error condition has occurred during the present state else subjects then freeze.

The same fast and slow inputs and outputs are monitored by the error detection circuits in both tester and subject, if an error is indicated in a *tester* cell where ACTIVE 100 is set, then FAULT 102 will be set but the cell will *neither* freeze *nor* power down. If an error is indicated in a *subject* cell where ACTIVE 100 is reset, that cell will freeze *and* power down.

If, after the controller 120 has filled the registers 54,52 the fault flip-flop 102 is set, and there is no output on the error line 64, the subject cell 132 is allowed to pass to further tests. If the fault flip-flop 102 is not set the subject cell 132 is incapable of acting as a tester and is therefore of no further use.

After filling the fast registers 54 and the slow registers 52 with the 2n+2 bit long pattern. The controller 120 issues a G1 signal which has the effect of sending all subject cells 132 where the fault flip-flop 102 is set into state 2 and powering down and freezing in state 1 all subject cells where the fault flip-flop 102 is not set. The act of passing into state 2 resets the fault flip-flop 102.

Figure 15:
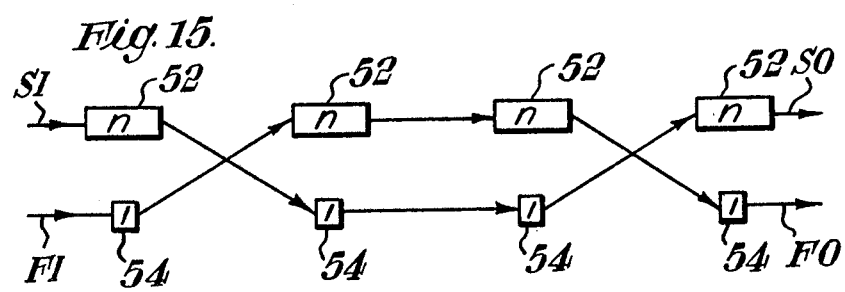
FIG. 15 shows the test pattern path through a cell during a second part of the test.

In state 2 the data integrity of the registers 52,54 and cross-over switching function of the matrixes 50 is tested. The controller 120 keeps the 2n+2 bit long data pattern circulating all the time. At least one data pattern is allowed to pass through each subject cell 132. The controller 120 then runs in a pattern of alternate 1s and 0s into the control register 56 and strobes the G2 signal to latch the matrixes 50 into the connection configuration shown in FIG. 15, the paths still being 2n+2 bits long. This action, since it maintains the paths at the same length, does not introduce an indication of error. Having allowed at least one 2n+2 bit long data pattern to pass through each subject cell 132, the controller then runs in a pattern of alternate 0s and 1s into the control registers 56 and issues another G2 signal to flip the connections of FIG. 15, i.e. cross-over where straight through previously and vice versa, still maintaining a path length of 2N+2 bits and therefore not inducing an indication of error. Having allowed at least one complete data pattern to pass through each subject cell 132, the controller runs all zeros into the control registers 56 and issues a G1 signal, which has the effect of sending all subject cells where there has not been an error, i.e. where the fault flip-flop 102 is not set, into state 3, and powering down and freezing in state 2 any subject cell 132 where there has been an error, i.e. the fault flip-flop is set, on the grounds that there is a fault in the cross-over function of the matrixes 50, the registers 52,54 or both.

In state 3 the error line 64 is disabled by logic element 80 from setting fault F/F 102, and the complete flip-flop 98 is tested. The controller 120 issues a G2 command which latches the zeros of the control registers 56 to the matrixes 50 and has the effect of setting the complete flip-flop 98 whose output is ignored by virtue of the state machine 58 being in state 3. The flip-flops 98,100 should initially have been reset by the Master reset signal MR. The function of the complete flip-flop 98, is to inhibit all further testing and labyrinth growth (when set other than in state 3). The function of the Active F/F 100 is to make a good tested (subject) chip into a tester, in which condition it continues to test its neighbors until Complete is set. When Active 100 is set, the chip does not respond to testing and connection signals. It is only necessary to test the complete flip-flop 98, since a failure of the active flip-flop 100 to reset on MR ensures that no testing will have taken place in the subject cell 132. In state 3 the controller, having set all of the matrixes 50 into the straight through mode, so that the path length between the slow incoming line SI and the slow outgoing line SO is 4N bits long and the path length between the fast incoming line FI and the fast outgoing line FO is 4 bits long, runs 4 bit repeating patterns into the fast in pad 200 and 4N bit long repeating patterns into the slow in pad 240 until it knows that the registers 52,54 are full by the reappearance of the 4N bit long patterns on the slow out pad 280. The controller then issues a G1 signal which has the effect of sending all subject cells 132 where the complete flip-flop 98 is set into state 4 and freezing, and powering down any subject cells 132 where the complete flip-flop 98 is not set.

The act of entering state 4 causes the complete flip-flop 98 to be reset and the error line 64 is enabled to set fault F/F 102.

The controller 120 keeps the wafer 10 in state 4 until a complete data pattern of 4N bits has passed through the slow registers 52. The controller 120 then applies a G1 signal which has the effect of sending all subject cells 132 which have not experienced a fault, i.e. wherein the fault flip-flop 102 is not set, into state 5, and freezing and powering down all subject cells 132 where the fault flip-flop is set.

In state 5 if the fault flip-flop 102 in a tester cell is reset such tester cells 130 continue to signal on their command lines 26 in the direction of the subject cells 132. The subject cells respond thereto by setting the CON F/F 51 in the appropriate direction selected by the connect command and the establish signal on connector 93.

The controller next issues a further G1 signal which has the effect of sending all newly tested cells into state 6 provided that the CON flip-flop 51 is set. If the CON flip-flop is not set the newly tested cell is frozen in state 5 and is powered down.

In state 6 tester cells 130 drop the signal on their command lines 26 and the newly tested subject cells 132 raise a signal on their command lines 26 in the direction of the tester cells 130. The controller 120 then applies the G1 signal to take all cells into state 7. In response to this, the tester cells 130 apply the establish signal on connector 93 which, in conjunction with the test command signal 68 sets the CON F/F 51 in the direction towards the subject cells 132 to confirm the connection established in the subject cells in state 5, provided that the Fault F/F's 102 in the tester cells are not set, and also provided that the said subject cells have raised the required signal on their command lines 26 in state 6. In state 7 those fully tested subject cells 132, having the CON F/F 51 set, now set the Active F/F 100 becoming in turn tester cells 130 ready for the next cycle of growth. All cells drop all signals on command lines 26 in state 7 and the controller 120 sends data into the slow registers 52 and waits for its return to measure the length of the memory achieved at the end of each growth phase.

If in state 6 the subject does not raise the command signal (because CON is not set or some other fault) the tester will not establish a connection in state 7 and the subject will be ignored (although powered up). Also in state 7 the tester may fail to set its CON F/F for some reason. Neither of these faults will affect the established labyrinth—the worst that can happen is that the (disconnected) subject becomes ACTIVE and starts to build its own separate labyrinth—this just wastes memory.

The controller 120 then applies yet another G1 signal to send the state machine 58 back to state 0. The controller 120 makes the decision if further growth is required. If further growth is required, a G1 signal is applied to the wafer 10 and it continues on a new cycle in the growth phase. If no further growth is required, the controller 120 sets the complete flip-flop 98 in every single cell 12 on the wafer 10, and thus inhibits all further testing and growth, by sending a G2 signal while the state machines 58 are in state 0. The controller 120 then signals to the host 122 that the memory that has been established is adequate and changes to an operational mode for servicing the data access of the memory in response to host commands.

It may be that the controller 120 has been unable to find a large enough memory space to satisfy the needs of the host 122. In this case the controller 120 may scrap the established memory by issuing the master reset MR signal and starting again from another edge of coupling port 14. Repeated failure will result in shutdown.

Figure 16:
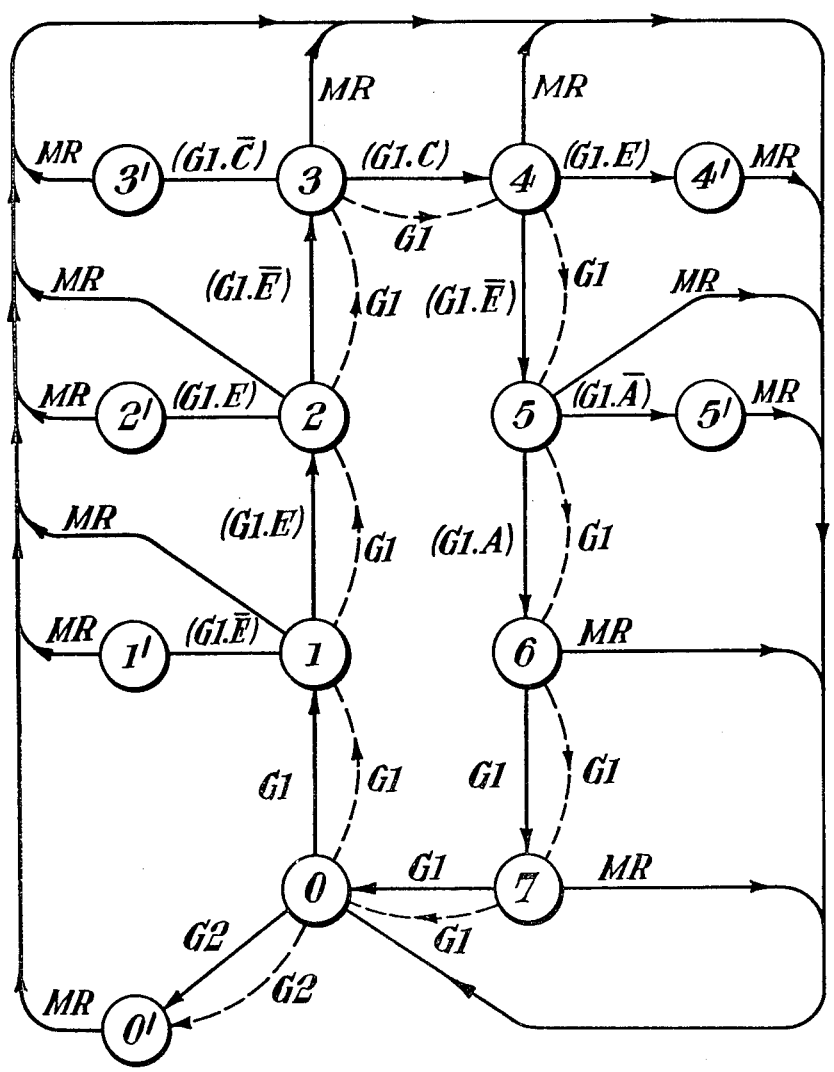
FIG. 16 shows the state diagram of the state machine.

The operation of the state machine 58 is shown and further described by the state diagram of FIG. 16. The transitions of the state machine 58 when in a subject cell 132 are indicated by solid line, and when in a tester cell 130 are shown by dotted line. Table 4 given hereinafter lists and explains the symbols used in FIG. 16. Eight main states 0 to 7 are shown, corresponding to the three bit count of the state counter 82. Five default states 1' to 5' are entered and maintained in the event of a functional test being failed in any of main states 1 to 5 respectively. The termination of growth state 0' is entered from state 0 by the controller 120 issuing a G2 signal instead of a G1 signal, whereafter the incorporated cells 12 are used as a data store for the host 122.

Table 5 summarizes the actions of the state machine 58 in a subject cell 132 as the state machine 58 moves between the states indicated in FIG. 16. Table 6 summarizes the actions of the state machine 58 in a subject cell 132 in each of the states of FIG. 16. Table 7 summarizes the actions of the state machine 58 in a tester cell 130 as the state machine moves between the states allowed to it in FIG. 16, and table 8 summarizes its action when in those states. Table 9 summarizes the actions of the controller 120 taken when the state machine 58 is in each state to test the data transfer properties of each cell 12 and to cycle the state machine 58 between states. The controller 120 has no direct feedback indicative of the state that any of the state machines 58 are in, but assumes that the state machines 58 respond to its sequence of input signals G1, G2, MR.

TABLE 4

| DEFINITIONS OF SYMBOLS USED IN FIG. 16 |
| --- |
| G1 = First Global Signal |
| G2 = Second Global Signal |
| E = An error has been detected by the checking logic in the Matrix 50, and the fault flip flop 102 is therefore set. |
| $\overline{E}$ = No error has been detected by the checking logic in the Matrix 50 and the fault flip flop 102 is therefore not set. |
| MR = Master Reset signal |
| C = Complete flip flop 98 is set |
| $\overline{C}$ = Complete flip flop 98 is not set |

TABLE 4-continued

| DEFINITIONS OF SYMBOLS USED IN FIG. 16 |
| --- |
| N = CON flip flop 51 is set |
| $\overline{N}$ = CON flip flop 51 is not set |

TABLE 5

ACTIONS OF THE STATE MACHINE 58 IN SUBJECT CELL 132 IN TRANSITIONS BETWEEN STATES

| TRANSITION | ACTION |
| --- | --- |
| 0 to 1 | Increment Direction Counter 86 |
| 1 to 2 | Reset Fault flip flop 102 |
| 2 to 3 | Set complete flip flop 98 |
| 3 to 4 | Reset complete flip flop 98 |
| 4 to 5 | NIL |
| 5 to 6 | NIL |
| 6 to 7 | NIL |
| 7 to 0 | NIL |
| 1 to 1' | NIL |
| 2 to 2' | NIL |
| 3 to 3' | NIL |
| 4 to 4' | NIL |
| ANY to 0 (MR) | Reset all counters and flip flops Remove power from registers etc. |

TABLE 6

ACTIONS OF THE STATE MACHINE 58 IN SUBJECT CELL 132 IN EACH STATE

| STATE | ACTION |
| --- | --- |
| 0 | NIL |
| 1 | Switch on power to registers and matrices when signal received from tester on command line 26. Set fault flip flop 102 if data error detected. Raise signal on connect coupling 60. |
| 2 | Set fault flip flop 102 if data error detected |
| 3 | Inhibit setting of fault flip-flop 102 |
| 4 | Set fault flip flop 102 if data error detected |
| 5 | Set CON F/F 51 |
| 6 | Raise command line 26 to tester |
| 7 | Set active flip-flop 100 Drop command line to tester |
| 1' | Remove power from registers etc. freeze |
| 2' | Remove power from registers etc. freeze |
| 3' | Remove power from registers etc. freeze |
| 4' | Remove power from registers etc. freeze |
| 5' | Remove power from registers etc. freeze |
| 0' | Not applicable, this state never entered by subject cell |

TABLE 7

ACTIONS OF THE STATE MACHINE 58 IN A TESTER CELL 130 IN TRANSITIONS BETWEEN ITS ALLOWED STATES

| TRANSITION | ACTION |
| --- | --- |
| 0 to 1 | Increment direction counter 86 |
| 1 to 2 | Reset fault flip-flop 102 |
| 2 to 3 | NO ACTION |
| 3 to 4 | NO ACTION |
| 4 to 5 | NO ACTION |
| 5 to 6 | NO ACTION |
| 6 to 7 | NO ACTION |
| 7 to 0 | NO ACTION |
| ANY to 0 (MR) | Reset all counters and flip flops |

TABLE 8

ACTIONS OF THE STATE MACHINE 58 IN A TESTER CELL 130 IN EACH OF ITS ALLOWED STATES

| STATE | ACTION |
| --- | --- |
| 0 | NIL |
| 1 | Apply test signal on test couplings 68 Raise signal on command line 26 |
| 2 | Set fault flip-flop 102 if data error |

TABLE 8-continued
ACTIONS OF THE STATE MACHINE 58 IN A TESTER CELL 130 IN EACH OF ITS ALLOWED STATES

| STATE | ACTION |
|---|---|
|  | detected |
| 3 | Inhibit setting of fault flip-flop 102 |
| 4 | Set fault flip-flop 102 if data error detected |
| 5 | NIL |
| 6 | Drop command signal on command line 26 |
| 7 | Set CON F/F 51 |
| 1' to 5' | Not applicable, these states never entered |
| 0' | Set complete flip-flop 98 |

TABLE 9
ACTIONS OF CONTROLLER 120 WHEN THE STATE MACHINE 58 IS IN EACH STATE

| STATE | ACTION |
|---|---|
| 0 | Issue G1 signal if growth is to continue, otherwise issue G2 signal to terminate growth. |
| 1 | Fill control registers 56 with all 1's then issue G2 signal, thereafter fill data registers with 2n + 2 bit long patterns. Lastly issue G1 signal. |
| 2 | Keep data pattern of state 1 circulating all the time. Allow one full pattern to pass, then run alternate 0's and 1's into control registers and issue G2 signal. Allow one further pattern to pass then run alternate 1's and 0's into control registers and issue G2 signal. Thereafter, run all 0's into control registers and issue G1 signal. |
| 3 | Issue G2 signal. Run 4n bit long pattern into slow registers and 4 bit long pattern into fast registers. Issue G1 signal. |
| 4 | Allow passage of at least 4n bits into and out of slow registers. Issue G1 signal. |
| 5 | Issue G1 signal |
| 6 | Issue G1 signal |
| 7 | Send data pattern around slow registers to measure length of memory achieved, then issue G1 signal. |
| 0' | Act as interface to host. |

(N.B.) the states 1' to 5' are not relevant to the actions of the controller 120 as they are entered autonomously by subject cells under fault conditions, such states never being apparent to controller 120.

The invention has so far been described with reference to having connections to the controller 120 on one edge only of the coupling port 14. It is advantageous to employ connections to two, three or four edges on the coupling port 14 so that the controller 120, when faced with a failure to establish a sufficiently large memory, may try again by starting at an alternative face.

Figure 17:
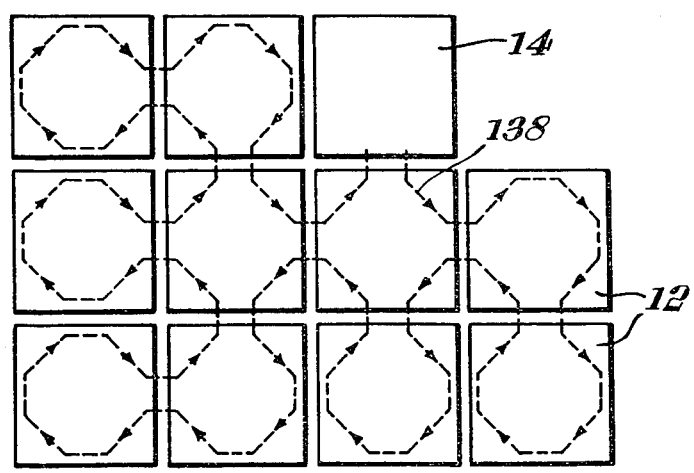
FIG. 17 shows the path of the serial shift register memory established by the testing.

FIG. 17 shows the layout, in physical terms, of the memory established by the controller 120, when the memory is finalized in a state corresponding to the growth point indicated in FIG. 9F.

The data path 138 wends a labyrinthine route between the cells 12 starting at and ending at the coupling port 14. The same is true no matter what the size of the established memory. The data path 138 comprises a fast data path consisting of the fast registers 54 connected in series, a slow data path consisting of the slow shift registers 52 connected in series, and a control path, consisting of the control registers 56 connected in series, all three paths running in parallel and all series connections being established through the matrixes 50. It is to be noted that the path 138, topologically speaking, may be represented as a single loop.

FIG. 18 shows a portion of the data path 138 stretched out into the topologically equivalent straight line. The chain of fast registers FA, FB, FC, FD are the one bit long fast shift registers 54WN, 54NE, 54ES, 54SW of FIG. 4, but, as will be appreciated from FIG. 17, the actual coupling need not be in any particular order. The chain of slow registers SA, SB, SC, SD, are the N-bit long shift registers 52WN, 52NE, 52ES and 52SW of FIG. 4. Once again, they need not be in any particular order and sequential members in the chain may be on adjacent cells 12. The chain of 1 bit long control shift registers CA, CB, CC and CD are the control registers 56WN, 56NE, 56ES and 56SW of FIG. 4. Yet again, they need not be in any particular order and sequential members of the chain may be in adjacent cells 12. The cross-over matrixes MA, MB, MC and MD are part of the switching matrixes 50N, 50E, 50S and 50W and they too are subject to the same indeterminacy of order. The latches LA, LB, LC and LD are individual elements in the 4 bit latch 96 of FIG. 8 and are operable, in response to the second global signal G2, to latch the state of the control registers CA, CB, CC and CD to the matrixes MA, MB, MC and MD, which respond to a latched logical 1 signal by going into the cross-over mode and in response to a latched logical 0 signal go into the straight through mode. The individual registers are physically associated, with the elements FA, SA, MA, LA, and CA being in the same quadrant of the same cell 12, FB, SB, MB, LB and CB being similarly associated, as are FD, SD, MD, LD and CD and FC, SC, MC, LC and CC.

FIG. 19A shows the addressing of a record in the chain 138.

The slow registers SA, SB, SC and SD are shown as containing between them, all of four data records R1, R2, R3 and R4 and part of a fifth data record R5. The records R1, R2, R3, R4 and R5 are each 1 bit shorter than the slow registers SA, SB, SC and SD. The first register SA contains all of the first record R1 and one bit of the second record R2. The second slow register S2 contains all but one bit of the second record R2 and two bits of the third record R3. The third slow register SC contains all but 2 bits of the third record R2 and three bits of the fourth record R3. The fourth slow register SD contains all but 3 bits of the fourth record R4, and four bits of the fifth record R5. This one-bit-at-a-time overspill continues up the chain 138. In general, if the slow registers SA, SB, SC, SD are each N bits long, it will take a maximum of N clock cycles to bring any particular record into a position to be accessed. In this example, the first record R1 is to be accessed. The controller 120 has been filling the control line with zeros prior to the first record R1 reaching the first matrix MA. All of the matrixes MA, MB, MC and MD are in the straight through position.

FIG. 19B shows the situation at the next clock pulse.

The controller 120 has previously calculated the number of clock pulses required before the first record R1 reaches the end of a slow register SA, SB, SC or SD and has, at the appropriate moment, fed a "1" into the control register chain such that it reaches the control register, in this case the first control register CA, at the same time as the beginning of the first record R1 reaches the output of the corresponding slow register SA. The controller 120 has been keeping track of all of the records by clock pulse counting as they shift along the chain 138, and feeding the records back into the beginning of the chain 138 as they fall out of the end of the chain 138 at the coupling port 14. The controller 120 selects, as the slow register from which to access a particular record, that slow register, in this example the first slow register SA, the output of which the particular record, in this case the first record R1, will reach in the minimum number of clock pulses. The controller 120 has, at the same time that it started sending the 1 into the control registers chain, started sending a serial bit representation of a replacement record R1' into the chain of fast registers such that the first bit of the replacement record R' reaches the first fast register FA at the same instant that the 1 reaches the first control register CA and the beginning of the first record R1 reaches the output of the first slow register SA. A succeeding record, R0, has begun to enter the first slow register SA. All records R1, R2, R3, R4, R5, R0 have moved up one bit place. The controller 120, having positioned the first record R1 at the output of the first slow register SA, the 1 on the control register C1 and the first bit of the replacement record R1' on the first fast register F1, then applies a second global signal G2 which has the effect of latching a zero into all matrixes save the first matrix MA, which, being in receipt of a latched 1, changes to the cross-over mode.

In the cross-over mode, the first matrix MA sends the first record R1 into the second fast register FB and the output of the first fast register FA into the second slow register SB. The first record R1 is thus sent, one bit for every successive clock pulse, into the fast chain, and thereon, at speed, to the coupling port 14, where it is extracted by the controller 120 for transmission to the host 122 if required, and the replacement record R1' is sent into the slow chain in place of the first record R1.

FIG. 19C shows the situation N clock pulses after the commencement of access.

The controller 120 has counted clock pulses and, N−1 clock pulses after the commencement of the data exchange, that is, just after the last bit of the first record R1 has passed out of the first slow register SA, has issued another second global signal G2. Since the control chain is filled with zeros the first latch LA latches a zero to the first matrix MA which is thereby set back into the straight through mode. The last bit of record R1 is then in fast register FB, the next-to-last bit in fast register FC, etc.

This completes the deposition and retrieval process for the first record R1. The controller 120 uses the same technique when accessing any other record.

It will be apparent that this simple method is inadequate to deal with the situation where the 1 in the control chain is still in the control chain when the end-of-record second global signal G2 is sent. It will be apparent that simple data replacement techniques and various manipulations of the control character on the control chain may overcome this problem. It is also possible to arrange that the number of bits in a record, N−1, is more than the maximum number of registers SA, SB, SC, SD etc. permissible in the chain 138, and to arrange that the controller 120 does not access a further record until it sees the 1 on the control chain returning to the coupling port 14. It will also be apparent that the controller 120, by manipulating the start-of-record and the end-of-record global signal G2, in conjunction with appropriate bit patterns in the control register chain, may read in and out an indefinitely and selectably long string of data, being many records, portions of records, and even portions contained within a record.

Figure 20:
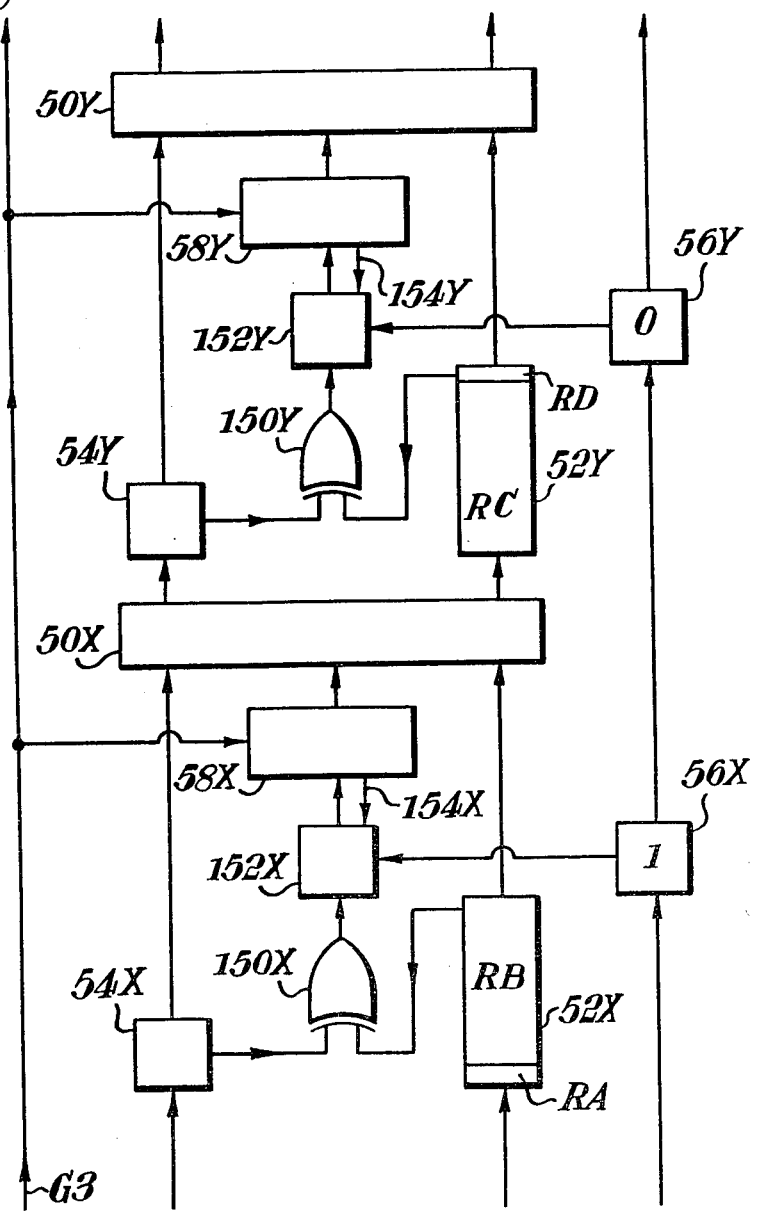
FIG. 20 shows a modification to make the chain into a content-addressable memory.

FIG. 20 shows how, by the addition of a data comparison facility between the fast and slow chains of FIG. 18, the memory is made both random access and content addressable.

Will all cells 12 in state 0' (COMPLETE 98 set) global signal G2 is used, in conjunction with 1's on the control register chain, to set switches 50 to cross-over mode. In state 0', global signal G1 can be used to place all cells in content addressable mode (state 0") in which state suitable signals on the control line can be used to set switches to cross-over mode when appropriate. Global signal G1 is used to return all cells to state 0' (random access) from state 0" when required.

The state machines 58X, 58Y in two consecutive members of the chain 138 are modified over those previously described to generate an enabling signal in response to the first global signal G1. Comparison gates 150X, 150Y compare the contents of the fast register 54X, 54Y with the first bit in the slow register 52X, 52Y. The comparison gate 150X, 150Y gives a logically true signal at its output if there is a difference between its inputs. The output of the comparison gate 150X, 150Y is coupled as a conditional reset input to a data selection flip-flop 152X, 152Y. The data selection flip-flop 152X, 152Y is also responsive to the initiating signal from the state machine 58X, 58Y on the initiating coupling 156X, 156Y and the enabling signal from the state machine 58X, 58Y on the enabling coupling 154X, 154Y. The flip-flop 152X, 152Y is set by the initiating signal from the state machine 58X, 58Y becoming logically true, and is reset whenever the enabling signal from the state machine 58X, 58Y is logically true and the comparison gate 150X, 150Y sees a data mismatch. The flip-flop 152X, 152Y stays reset or set despite data mismatches if the enabling signal becomes false.

On entering the content-addressable state (after G1 signal) flip-flop 152 is reset and the state machine 58 is responsive to pairs of bits on the control line i.e. the bit currently in register 56 and the immediately following bit (seen as the input 56). When 56 contains a '1' and the following bit is '0', initiating line 156 is raised to set flip-flop 152 (and dropped on the following clock cycle) and enabling line 154 is also raised to enable data/key comparison to be made by gate 150. A subsequent '10' bit pattern on the control line will reset the enabling line 154, disabling data comparisons so that mismatches have no effect on flip-flop 152. Data comparison is again enabled by another '10' bit pattern, so providing a masking function. At any time subsequent to the first, initiating '10' pattern, a '11' bit pattern on the control line will cause the state machine 58 to set the matrix 50 to the cross-over mode if, and only if, the flip-flop 152 is set. The timing of the '11' bit pattern by the controller 120 is such that the desired matched record, or part thereof, is correctly provided as output onto the fast line 54. A subsequent '11' pattern returns all matrixes 50 to straight-through mode and resets all flip-flops 152 ready for another comparison sequence.

The data records RA, RB, RC, RD as shown in FIG. 20 are still one bit shorter than the slow registers 52X, 52Y.

The controller 120 runs a literal, a serial data word, which is to be matched against the data in the slow registers 52X, 52Y and so on, as a key match, into the fast line in synchronism with a mask sequence of pairs of 1s and 0s into the control line. Whenever a 10 pair reaches the control register 56X, 56Y the data comparison is alternately enabled and disabled.

To illustrate access by content addressing, FIG. 20 shows the first bit of record RA entering slow register 52X, record RB occupying the remainder of slow register 52X, and slow register 52Y containing record RC and the last bit of record RD. The literal, or key, to be matched against the data records is input to the fast registers, with its first bit in register 54X currently being compared with the first bit of record RA. The control register 56X contains a '1' with the following bit (the input to 56X) being a '0', causing flip-flop 152X to be set by initiating signal 156X and enabled by line 154X. If the key and record comparison shows a match (logically false output from gate 150X) flip-flop 152X remains set.

At the next clock cycle the second bit of record RA enters slow register 52X and the first bit of record RB enters slow register 52Y. The first bit of the comparison literal moves on to fast register 54Y and is compared with the first bit of record RB via gate 150V. Flip-flop 152Y is set and enabled by the '1' now in control register 56Y and the '0' in control register 56X. If there is a mismatch between the literal and RB, flip-flop 152Y will be reset, otherwise it will remain set. Within this same clock period the second bit of the literal in fast register 54X is compared with the second bit of record RA and flip-flop 152X either remains set if the bits match, or is reset by a mismatch. The comparison process can be disabled at any time by the propagation of a '10' bit pair along the control line, and subsequently re-enabled by another '10' bit pair, allowing selected fields of the comparison literal to be masked.

During subsequent clock periods the data records and the comparison literal continue to move along the slow and fast lines, respectively, with the result that the literal is compared bit-by-bit with each and every data record (subject to any required masking) in the time taken for the literal to completely traverse the length of the fast line

What I claim is:

1. A wafer scale integrated circuit for data storage use in a data processing system including a host processor and a controller, the controller communicating between the host processor and wafer scale integrated circuit, the wafer scale integrated circuit having multiple cells which are tested and grown into a labyrinth array at an accelerating growth rate, each cell having data storage registers, each said cell comprising:
   means for communicating with adjoining cells;
   means for testing adjoining cells, said testing means communicating with said adjoining cells by said means for communicating, said controller providing a first command signal to said testing means to initiate testing of adjoining cells;
   means for changing the direction of testing by said testing means, said controller providing a second command signal to said means for changing direction to initiate a change in the direction of testing by said testing means, each said means for testing performing tests simultaneously in one direction in response to said second command signal;
   means for providing an indication of successful testing of a tested cell and coupling of said testing and tested cells to form a chain of coupled cells, said tested cells becoming a testing cell; and,
   said testing cells forming a growing labyrinth array of cells, each said testing cell responding to said means for changing direction to simultaneously test untested adjoining cells in one direction, to cause multiple adjoining cells to become tested and coupled, said labyrinth growth accelerating as more testing cells are available to test adjoining cells, said storage registers of each testing cell coupled together through said means for communicating to form a chain of data storage registers.

2. The integrated circuit of claim 1 in which one of said cells is an initial cell directly connected to said controller through said means for communicating, said initial cell being tested by said controller and becoming the first testing cell from which said labyrinth array will grow.

3. The apparatus of claim 2 having a means for accessing data stored in data storage registers of each cell having an indication of successful testing, said means for accessing including fast bit registers in each successfully tested cell which are coupled together through said means for communicating to form a chain of fast bit registers parallel to said chain of data storage registers, said means for accessing further including control registers in each successfully tested cell which are coupled together through said means for communication to form a chain of control registers parallel to said chain of data storage registers, said control registers controlling an exchange of data between said chain of data storage registers and said chain of fast bit registers, data from said chain of data storage registers being read out at a rapid rate through said chain of fast bit registers.

4. The apparatus of claim 3 in which said means for communicating includes multiple matrix switches on said multiple sides of each cell, each matrix switch communicating with a matrix switch on the opposing side of an adjacent cell, said matrix switches additionally communicating between said data storage registers, said fast bit registers and said control registers in each cell.

5. The apparatus of claim 4 in which said means for testing includes a state machine having logic to conduct the testing of adjoining cells, said state machine further having a command decoder to decode command signals from said controller and provide control signals to said logic for testing said first and second command signals included in said controller command signals.

6. The apparatus of claim 5 in which said means for communicating includes a cross-over switch, a latch, and a data comparator, said data comparator comparing, bit-by-bit, the first bit in said data storage shift register and the output of said fast bit register and being operable to perform a comparison operation for providing to said latch an output indicative of a match whenever they are the same, said latch being settable whenever a first predetermined character is presented to said control register, and latch being resettable in response to said data comparator failing to provide said output indicative of a match during the course of said comparison operation, and said data comparator alternately suspending and recommencing said comparison operation in response to alternate subsequent presentations of said first predetermined control character, said cross-over switch being operable in response to said latching being set and to the presentation of a second predetermined control character to said control register and said cross-over switch being disabled in response to subsequent representation of said second predetermined control character to said control register.

7. The apparatus of claim 6 in which said means for changing direction of testing includes a direction counter in said state machine, said direction counter receiving a signal from said logic to change the direction of testing after one cycle of testing has taken place and another is to be initiated, said direction counter providing a signal which will control the direction in which testing is done.

8. The apparatus of claim 7 in which said means for providing an indication of a successful testing of a tested cell and coupling of said testing and tested cells includes an active flip-flop, said active flip-flop being set after all states of testing have been completed by said logic, said active flip-flop indicating that said tested cell has become a testing cell.

9. The apparatus of claim 8 in which each cell has power continuously applied to said state machine, each cell further has a power switch operable in response to an input from said logic of said state machine to supply power to the remainder of the cell, said logic monitoring the communications through said means for communication between said testing and said tested cell to ascertain if communication is established between said tested and testing cells, said logic providing said input to said power switch when communication is established, said logic further monitoring said testing to determine if a failure occurs and providing an input to said power switch to remove power from the remainder of the cell if a failure occurs.

* * * * *

UNITED STATES PATENT AND TRADEMARK OFFICE
CERTIFICATE OF CORRECTION

PATENT NO. : 4,471,483

DATED : September 11, 1984

INVENTOR(S) : John Terence Chamberlain

It is certified that error appears in the above-identified patent and that said Letters Patent is hereby corrected as shown below:

Column 3, line 5, delete "integrted" and substitute --integrated--; Column 5, line 48, delete second occurrence of "pad 260"; Column 5, line 54, delete "o" and substitute --of--; Column 8, line 12, delete "rest" and substitute --reset--; Column 8, line 49, delete "or" and substitute --OR--.

In Claim 6, line 50, delete "and" and substitute --said--.

In Claim 6, line 57, delete "latching" and substitute --latch--.

*Signed and Sealed this*

*Second Day of April 1985*

[SEAL]

*Attest:*

DONALD J. QUIGG

*Attesting Officer*     *Acting Commissioner of Patents and Trademarks*